(12) United States Patent
Gomikawa et al.

(10) Patent No.: US 7,772,618 B2
(45) Date of Patent: Aug. 10, 2010

(54) SEMICONDUCTOR STORAGE DEVICE COMPRISING MIS TRANSISTOR INCLUDING CHARGE STORAGE LAYER

(75) Inventors: Kenji Gomikawa, Yokohama (JP); Mitsuhiro Noguchi, Yokohama (JP); Takashi Aoi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 468 days.

(21) Appl. No.: 11/770,415

(22) Filed: Jun. 28, 2007

(65) Prior Publication Data

US 2008/0001206 A1 Jan. 3, 2008

(30) Foreign Application Priority Data

Jun. 29, 2006 (JP) .............................. 2006-179835

(51) Int. Cl.
*H01L 29/76* (2006.01)
(52) U.S. Cl. ................ 257/255; 257/314; 257/E29.229
(58) Field of Classification Search .................. 257/255, 257/314, E29.229
See application file for complete search history.

(56) References Cited

U.S. PATENT DOCUMENTS 3,969,753 A * 7/1976 Thorsen et al. ............. 257/507
5,729,045 A * 3/1998 Buynoski ..................... 257/627
7,298,009 B2 * 11/2007 Yan et al. ..................... 257/357

FOREIGN PATENT DOCUMENTS

JP 2002-324400 11/2002
JP 2006-73939 3/2006

* cited by examiner

*Primary Examiner*—Roy K Potter
(74) *Attorney, Agent, or Firm*—Oblon, Spivak, McClelland, Maier & Neustadt, L.L.P.

(57) ABSTRACT

A semiconductor memory device includes a memory cell block. The memory cell block includes a plurality of n-type first MIS transistors with current passages connected in series. Each of the first MIS transistors includes a source, a drain, and a charge storage layer formed on a (001)-plane of a semiconductor substrate with a gate insulating film interposed therebetween and is configured to store data. A direction from the source to the drain in each of the first MIS transistors is set parallel to a [001]-direction or [010]-direction of the semiconductor substrate.

11 Claims, 18 Drawing Sheets

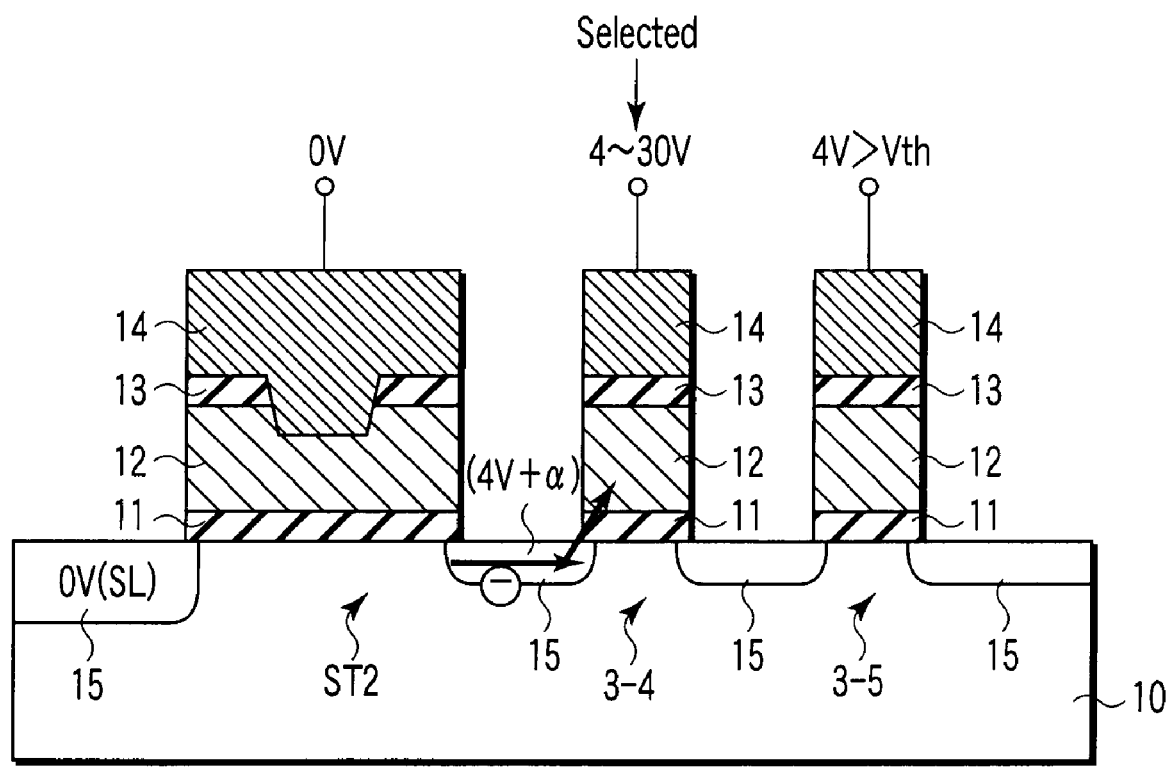
F I G. 15

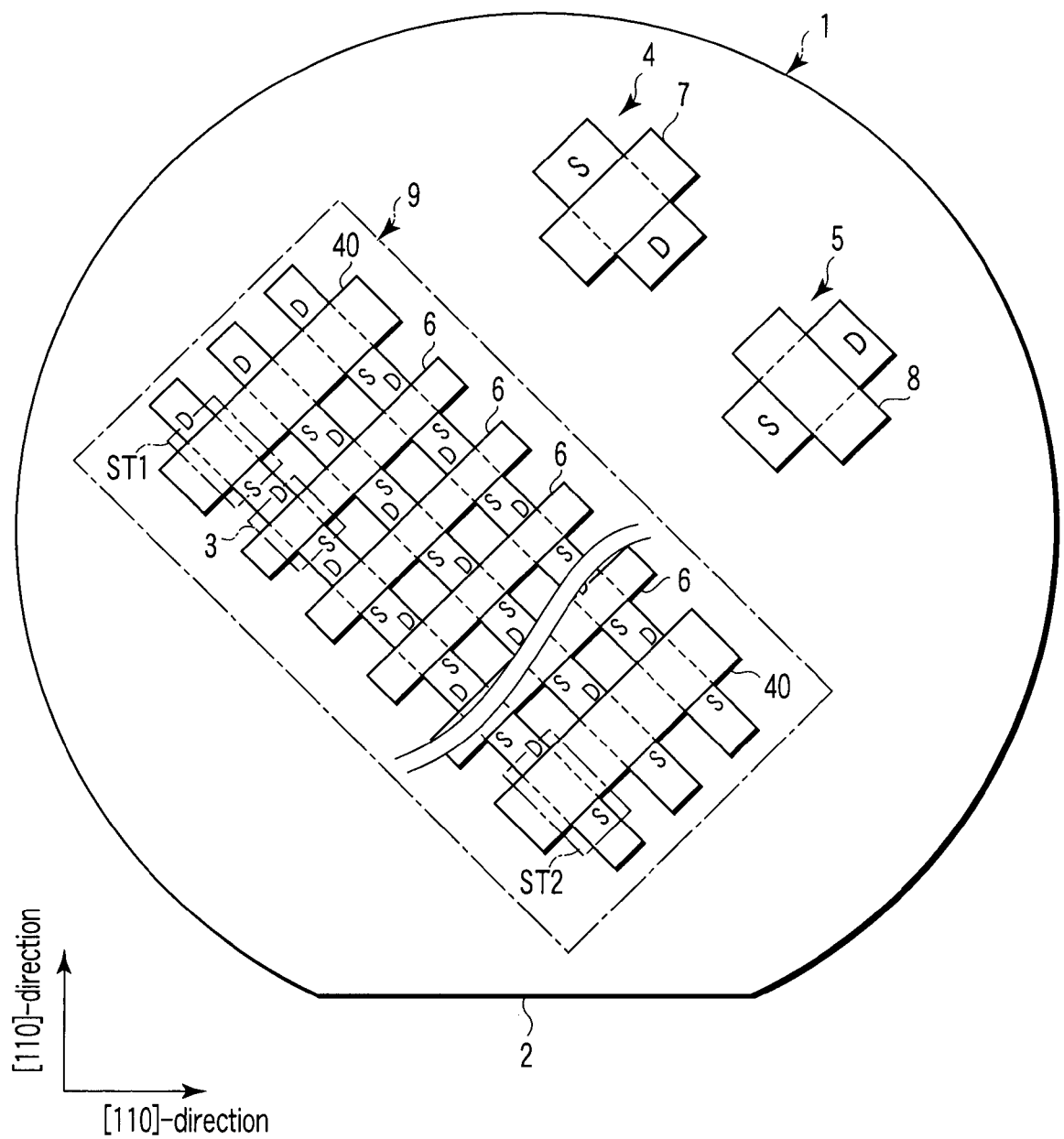
F I G. 17

US 7,772,618 B2

SEMICONDUCTOR STORAGE DEVICE COMPRISING MIS TRANSISTOR INCLUDING CHARGE STORAGE LAYER

CROSS-REFERENCE TO RELATED APPLICATIONS

This application is based upon and claims the benefit of priority from prior Japanese Pat. Application No. 2006-179835, filed Jun. 29, 2006, the entire contents of which are incorporated herein by reference.

BACKGROUND OF THE INVENTION

1. Field of the Invention

The present invention relates to a semiconductor storage device, such as a semiconductor storage device including a MIS transistor including a charge storage layer.

2. Description of the Related Art

Conventionally, NAND-type EEPROMs are widely used as nonvolatile semiconductor memories. A NAND-type EEPROM includes a memory cell array and a peripheral circuit disposed around the array. A structure of this type is disclosed in, e.g., Jpn. Pat. Appln. KOKAI Publication No. 2002-324400.

In a conventional NAND-type EEPROM, the direction from the source to the drain in each memory cell is parallel to or perpendicular to the direction from the source to the drain or the direction from the drain to the source in each MIS transistor in the peripheral circuit. This arrangement is intended to facilitate placement of transistors and resist openings used in photolithography steps.

Further, conventionally, a NAND-type EEPROM is formed on the (001)-plane of a semiconductor substrate, wherein the direction from the source to the drain in each memory cell is parallel to the [110]-direction of the semiconductor substrate (crystal orientation). This is so, because silicon crystal mainly used for semiconductor substrates has a cleavage property in the [110]-direction. Accordingly, in the NAND-type EEPROM, the direction from the source to the drain or the direction from the drain to the source in each MIS transistor in the peripheral circuit is also parallel to the [110]-direction.

However, the conventional NAND-type EEPROM described above has a problem in that program disturbance is caused due to generation of hot carriers within memory cells. Further, carriers in each MIS transistor flow in the [110]-direction of the semiconductor substrate. Consequently, the performance of an n-type MIS transistor is larger than that of a p-type MIS transistor. This brings about a problem in that the performance difference between the n-type MIS transistor and the p-type MIS transistor becomes larger.

BRIEF SUMMARY OF THE INVENTION

A semiconductor memory device according to an aspect of the present invention includes:

a memory cell block including a plurality of n-type first MIS transistors with current passages connected in series, each of the first MIS transistors including a source, a drain, and a charge storage layer formed on a (001)-plane of a semiconductor substrate with a gate insulating film interposed therebetween and configured to store data, and a direction from the source to the drain in each of the first MIS transistors being set parallel to a [001]-direction or [010]-direction of the semiconductor substrate.

BRIEF DESCRIPTION OF THE SEVERAL VIEWS OF THE DRAWING

FIG. 15 is a sectional view showing a semiconductor storage device according to the second embodiment of the present invention;

FIG. 17 is a plan view showing a semiconductor wafer with a semiconductor storage device formed thereon, according to a second modification of the second embodiment of the present invention;

DETAILED DESCRIPTION OF THE INVENTION

In the specification, each direction of crystal orientation described hereinafter encompasses all the directions equivalent thereto based on crystallography. Further, negative Miller indices are expressed with a symbol "−", as in "−1". For example, the (001)-plane is equivalent to the (100)-plane, (010)-plane, (−100)-plane, (0-10)-plane, and (00-1)-plane.

FIRST EMBODIMENT

Figure 1:
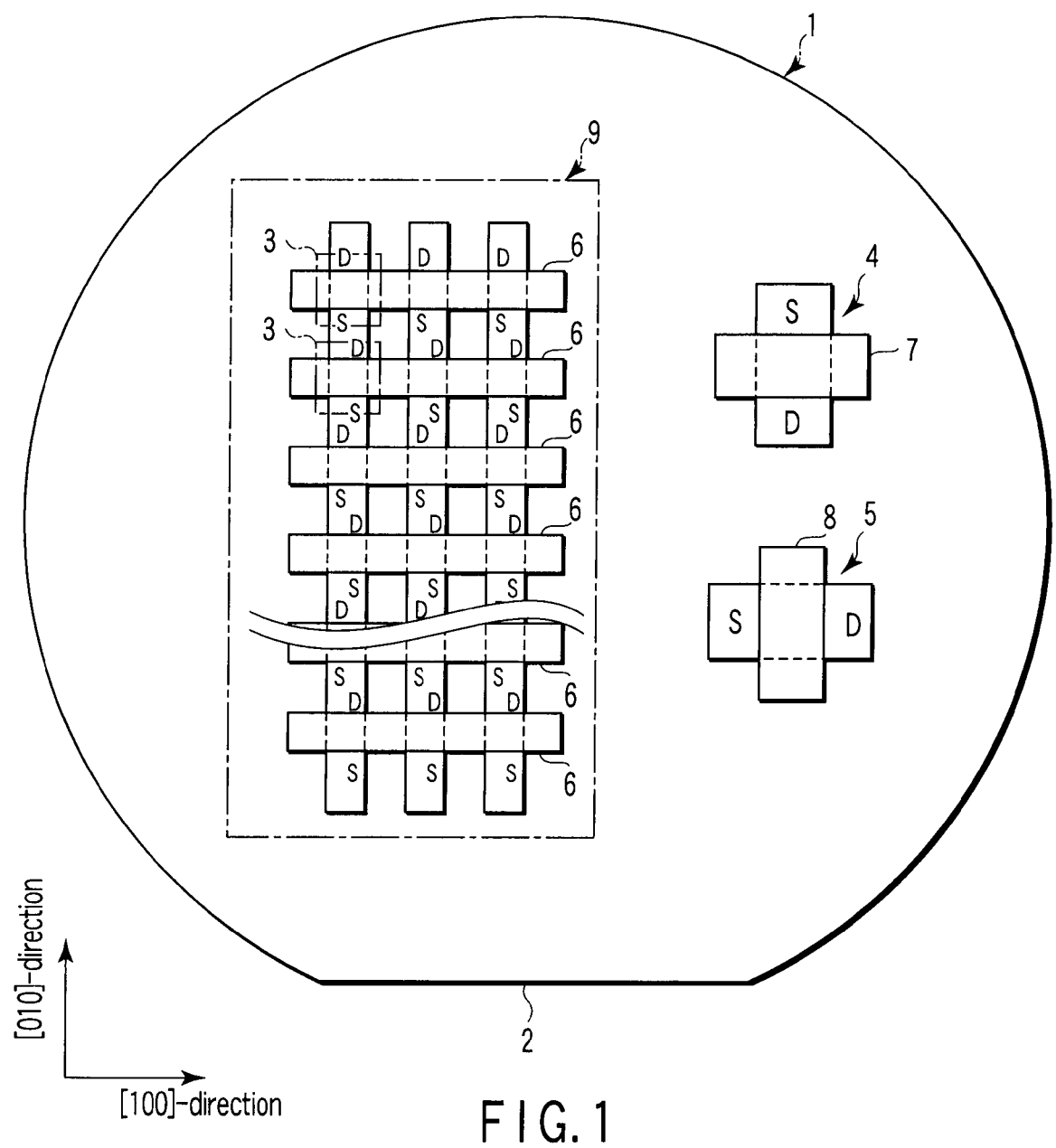
FIG. 1 is a plan view showing a semiconductor wafer with a semiconductor storage device formed thereon, according to a first embodiment of the present invention.

An explanation will be given of a semiconductor storage device according to a first embodiment of the present invention, with reference to FIG. 1. FIG. 1 is a plan view showing a semiconductor device (semiconductor wafer) with a semiconductor storage device formed thereon, according to this embodiment, and schematically showing the placement of transistors on the wafer. In the drawings, the regions indicated by "S" and "D" are regions in which the source and drain of a transistor are formed, respectively.

In FIG. 1, the main surface of a semiconductor wafer 1 is defined by the (001)-plane. The wafer 1 has an orientation flat 2 on the peripheral edge. The orientation flat 2 is used for aligning the orientation of a plurality of semiconductor wafers in semiconductor manufacturing steps. The orientation flat 2 is set parallel to the [100]-direction of the wafer 1. Accordingly, the direction perpendicular to the orientation flat 2 is parallel to the [010]-direction on the surface of the wafer 1.

The main surface of the semiconductor wafer 1 is provided with a plurality of memory cells 3 respectively formed of n-type MISFETs each including a charge storage layer, and p-type MISFETs 4 and 5, formed thereon. Each of the memory cells 3 and p-type MISFET 4 is arranged such that the direction from the source to the drain, i.e., channel length direction, is parallel to the [010]-direction of the wafer 1. In other words, the gate electrode 6 of each memory cell 3 and the gate electrode 7 of the p-type MISFET 4 have a gate width direction parallel to the [100]-direction. On the other hand, the p-type MISFET 5 is arranged such that the direction from the source to the drain, i.e., channel length direction, is parallel to the [100]-direction of the wafer 1. In other words, the gate electrode 8 of the p-type MISFET 5 has a gate width direction parallel to the [010]-direction. The current passages of the memory cells 3 are connected to each other in series, so that the memory cell array 9 of a NAND-type EEPROM is formed. In place of the [010]-direction, the direction from the source to the drain of each memory cell 3 may be set parallel to a direction equivalent thereto, such as the [100]-direction, based on crystallography. It should be noted that the "gate width direction" is the same as the channel width direction, which is perpendicular to the channel length direction. In other words, this direction is perpendicular to the direction in which the source, channel, and drain are arrayed.

The arrangement described above provides the following effects (1) and (2).

(1) The operational reliability of a NAND-type EEPROM is improved (a first issue).

In the arrangement according to this embodiment, each memory cell 3 is formed on the (001)-plane of the semiconductor wafer 1 such that the direction from the source to the drain is parallel to the [010]-direction or [100]-direction (or a direction equivalent thereto). In this case, the lifetime of hot carrier injection can be prolonged in the memory cell, which is formed of an n-type MISFET. Consequently, it is possible to prevent program disturbance from being caused in the NAND-type EEPROM. This effect will be explained in detail below.

Figure 2:
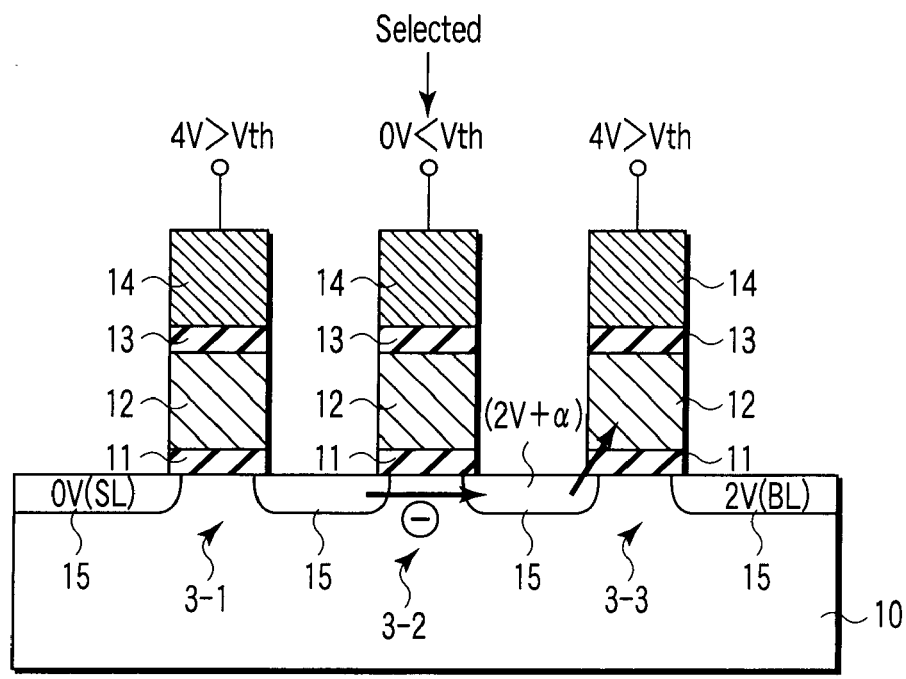
FIG. 2 is a sectional view showing a semiconductor storage device according to the first embodiment of the present invention.

In general, where hot carriers are generated, the performance to supply current of a transistor is deteriorated. Consequently, operation disturbance may be caused in writing, erasing, and reading operations in memory cells. The phenomenon of program disturbance being caused by hot carrier injection will be explained, with reference to FIG. 2. FIG. 2 is a sectional view showing a part of the memory cell array of a NAND-type EEPROM, and showing three memory cells 3.

As shown in FIG. 2, each of the memory cells 3 has a stacked gate. The stacked gate includes a floating gate electrode 12 formed on a p-type well region 10 with a gate insulating film 11 interposed therebetween and serving as a charge storage layer, and a control gate electrode 14 formed on the floating gate electrode 12 with an inter-gate insulating film 13 interposed therebetween. The well region 10 has impurity diffusion layers 15 formed therein between the stacked gates and serving as the source and drain of the memory cells 3. FIG. 2 only shows portions necessary for explanation of this effect.

For the sake of simplicity in explanation, the memory cells 3 are named memory cells 3-1, 3-2, and 3-3 in this order from the source line SL side. As an example, the following explanation will be given of a case where reading is performed to select the memory cell 3-2 and read data from the memory cell 3-2.

In this case, the control gate electrode 14 of the selected memory cell 3-2 is supplied with a voltage, such as 0V, which is lower than the threshold voltage Vth of the memory cell 3-2. On the other hand, the control gate electrodes 14 of the other non-selected memory cells 3-1 and 3-3 are supplied with a voltage, such as 4V or more, which is higher than the threshold voltage Vth of the memory cells 3-1 and 3-3.

The impurity diffusion layer 15 between the memory cells 3-1 and 3-2 is connected to the source line, and thus is set at a voltage essentially equal to 0V. On the other hand, the electric potential of the impurity diffusion layer 15 between the memory cells 3-2 and 3-3 is increased to a voltage (=2V+ α) slightly lower than the voltage (>4V) applied to the control gate electrode 14 of the memory cell 3-3, due to the capacitive coupling with the stacked gate of the memory cell 3-3.

Then, the electric potential difference between the source and drain in the selected memory cell 3-2 is increased, and thereby causes punch-through therebetween. Consequently, electrons are input from the source to the drain in the selected memory cell 3-2. The input electrons have a sufficiently high kinetic energy and act as hot electrons. Then, the hot electrons are injected into the floating gate electrode 12 or gate insulating film 11 of the non-selected memory cell 3-3 in the data transfer line side. Where hot electrons are injected into the floating gate electrode 12, the electrons are accumulated in the floating gate electrode 12, and program disturbance of data may be thereby caused. Where hot electrons are injected into the gate insulating film 11 and trapped there, the threshold voltage Vth of the non-selected memory cell 3-3 is increased, and an operation disturbance may be thereby caused.

Figure 3:
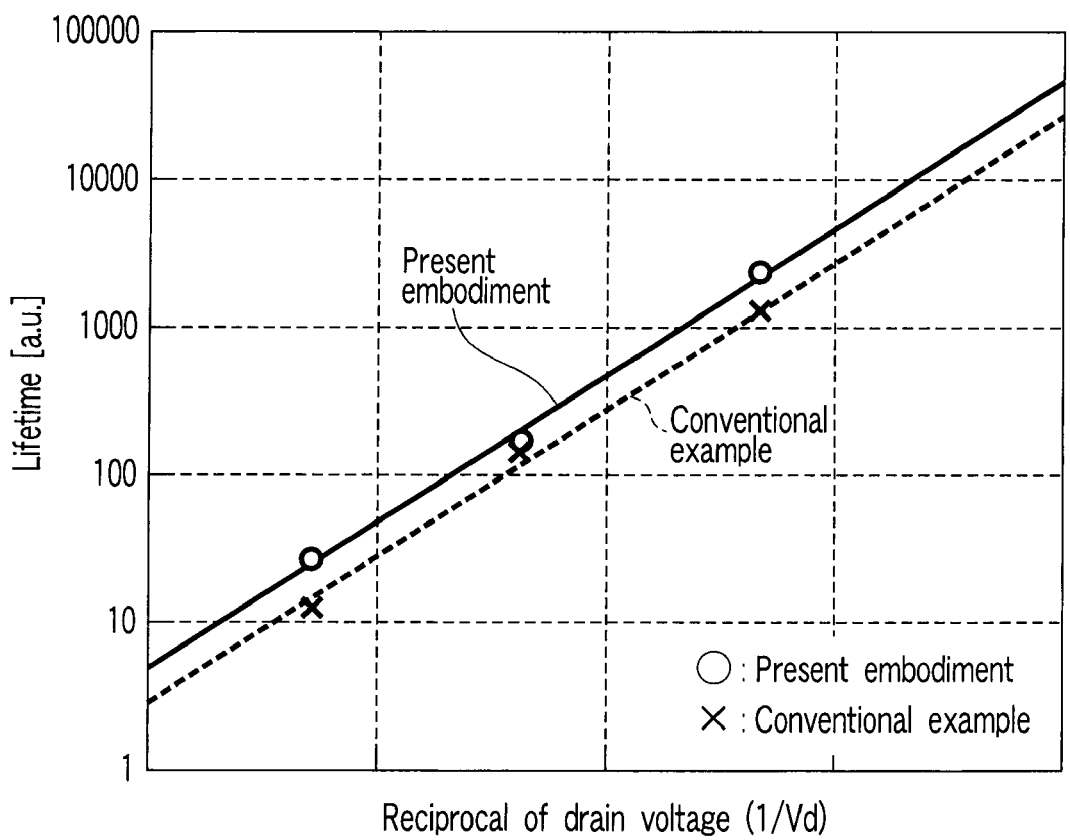
FIG. 3 is a graph showing the relationship between the reciprocal of drain voltage and the lifetime of hot carrier injection in a semiconductor storage device according to the first embodiment of the present invention and a conventional semiconductor storage device.

As described above, hot carriers (hot electrons) may bring about operation disturbance in a NAND-type EEPROM, and the operation disturbance can be a serious problem due to the advance in miniaturization. Under the circumstances, the present inventors have found for the first time that generation of hot carriers can be suppressed where a NAND-type EEPROM is arranged such that the direction from the source to the drain in each memory cell is parallel to the [100]-direction or [010]-direction. Consequently, it is possible to prevent operation disturbance from being caused in the NAND-type EEPROM, thereby improving the operational reliability thereof. FIG. 3 is a graph showing the lifetime of hot carrier injection in a memory cell 3 according to this embodiment and a conventional memory cell. In FIG. 3, the solid line indicates this embodiment, the dashed line indicates the conventional example, the vertical axis denotes the lifetime in log scale, and the horizontal axis denotes the reciprocal of drain voltage Vd. The lifetime is the length of time of application of drain voltage Vd, and represents a threshold value beyond which program disturbance is caused (i.e., erroneous data is written). In other words, if a drain voltage Vd is applied for a length of time not less than the corresponding lifetime, the data in a non-selected memory cell is inverted due to an effect of hot carrier injection (program disturbance is caused). Accordingly, as long as a drain voltage Vd is applied for a length of time less than the corresponding lifetime, the data does not come to be inverted (program disturbance is not caused), even if hot carriers are injected into the floating gate electrode. Further, in other words, the lifetime is an elapsed length of time before the performance is decreased by an effect of hot carrier injection to a level at which an operation disturbance may be caused.

As shown in FIG. 3, the arrangement according to this embodiment provides a lifetime of hot carrier injection about 1.5 times larger than that provided by the conventional example. In other words, the arrangement according to this embodiment does not cause programming data until the length of time of application of drain voltage Vd exceeds a value 1.5 times larger than that for the conventional example. Accordingly, this embodiment can provide a NAND-type EEPROM that improves program disturbance, as compared to the conventional example. Further, since this embodiment can suppress a decrease in the performance to drive a gate, as compared to the conventional example, electrons are less trapped in the gate insulating film. Consequently, this embodiment makes it possible to improve the operational reliability of a NAND-type EEPROM.

The problem described above due to hot carrier injection is peculiar to semiconductor memories arranged to write data by FN (Fowler-Nordheim) tunneling. For example, this problem is not caused in semiconductor memories arranged to write data by using hot carrier injection. This data writing by FN tunneling is a method for injecting electrons or holes into a charge storage layer by quantum tunneling, which may be performed, as follows, for example. Specifically, the source and drain of a memory cell are set at an equal electric potential, while the gate thereof is supplied with a positive voltage. Consequently, electrons are injected into the charge storage layer thereof through the gate insulating film by a tunnel phenomenon. Alternatively, the gate of a memory cell is supplied with a positive voltage, and electrons are injected from the source and drain or the channel formed therebetween into the charge storage layer through the gate insulating film by quantum tunneling.

Further, such problem that the reliability is deteriorated due to hot carrier injection is prominent in NAND-type EEPROMs. This is so, because NAND-type EEPROMs particularly confront advance in miniaturization, and thus have a small distance between adjacent memory cells. Accordingly, where an arrangement according to this embodiment is applied to a NAND-type EEPROM, a remarkable effect is obtained.

(2) The performance to drive a current of a p-type MISFET is improved.

Figure 4:
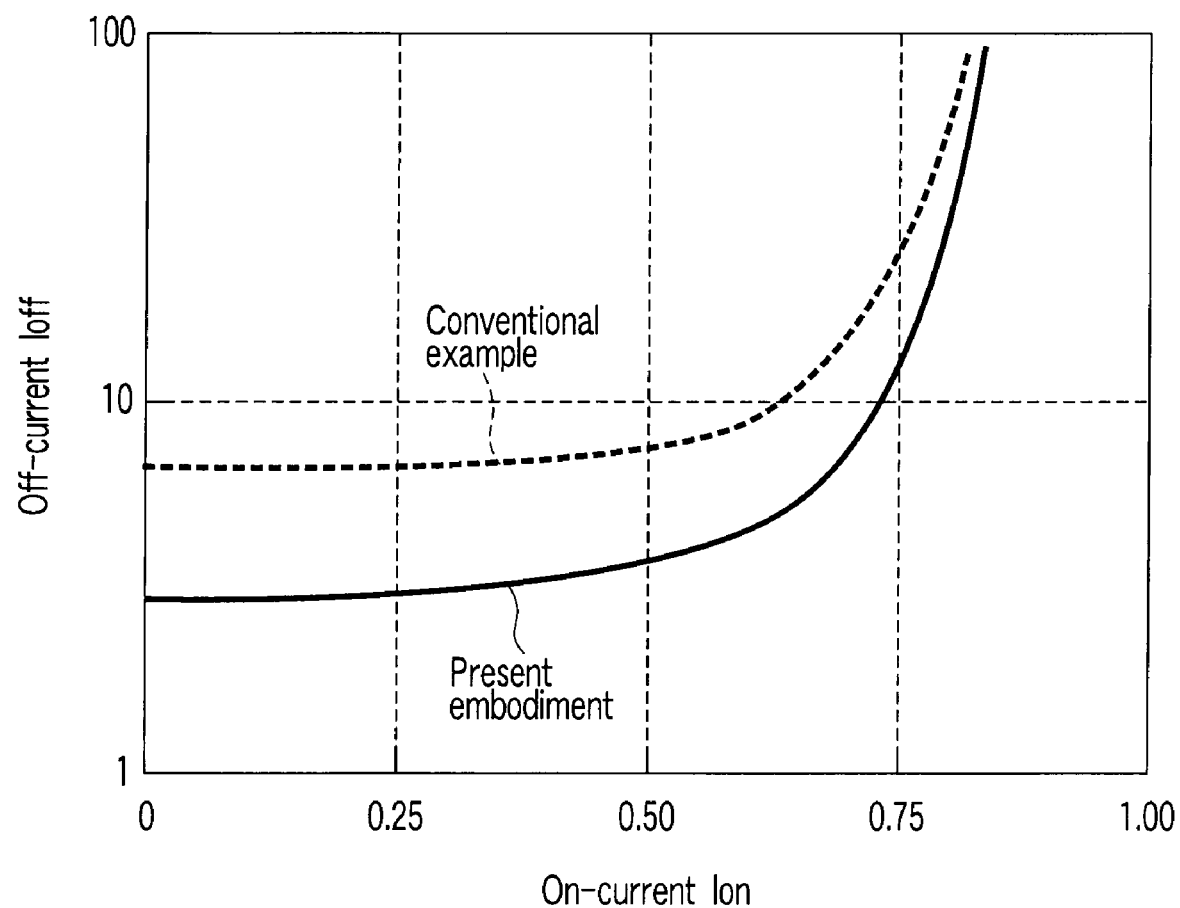
FIG. 4 is a graph showing the relationship between the on-current and off-current in a semiconductor storage device according to the first embodiment of the present invention and a conventional semiconductor storage device.

In the arrangement according to this embodiment, each p-type MISFET is arranged on the (001)-plane of the wafer 1 such that the direction from the source to the drain is parallel to the [100]-direction or [010]-direction. Consequently, the performance to drive a current of each p-type MISFET is improved. FIG. 4 is a graph showing a characteristic about the performance to drive a current of a p-type MISFET according to this embodiment and a conventional p-type MISFET. In FIG. 4, the solid line indicates this embodiment, the dashed line indicates the conventional example, the horizontal axis denotes the on-current, and the vertical axis denotes the off-current. As shown in FIG. 4, the arrangement according to this embodiment provides an improvement in the performance to drive a current, as compared to the conventional example. In a measurement result obtained by the present inventors, it was confirmed that the arrangement according to this embodiment provided a 10% improvement in the performance to drive a current, as compared to the conventional example.

Further, the effect described above brings about another effect such that the size of a semiconductor device can be decreased. In general, the performance to drive a current of a p-type MISFET is lower than that of an n-type MISFET, where their sizes are equal. Accordingly, in order to obtain a uniform performance to drive a current, a p-type MISFET needs to be formed larger than an n-type MISFET; which increases the chip area. However, where an arrangement according to this embodiment is applied to a p-type MISFET, the difference in the performance to drive a current between the p-type MISFET and n-type MISFET becomes smaller. In this case, the p-type MISFET does not need to have a size increased as in the conventional case. As the case may be, the p-type MISFET and n-type MISFET may be set to have the same size. Consequently, the size of a semiconductor device can be decreased, along with p-type MISFETs having a decreased size.

Figure 5:
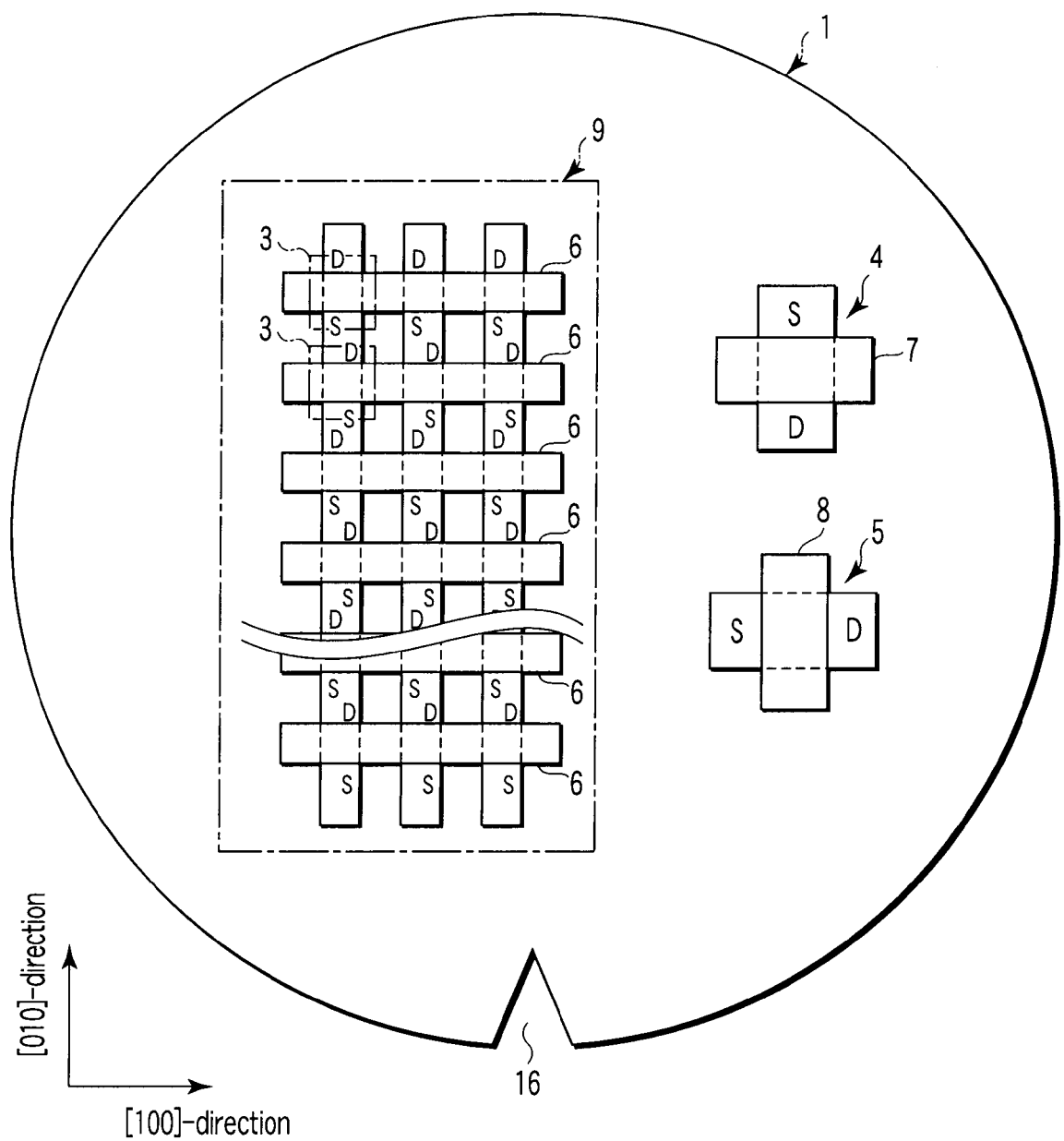
FIG. 5 is a plan view showing a semiconductor wafer with a semiconductor storage device formed thereon, according to a first modification of the first embodiment of the present invention.

In this embodiment, it suffices if each MISFET is arranged such that the direction from the source to the drain is parallel to the [100]-direction or [010]-direction. Accordingly, as shown in the plan view of FIG. 5, this embodiment may be applied to a semiconductor wafer 1 having a notch 16 in place of the orientation flat 2.

Figure 6:
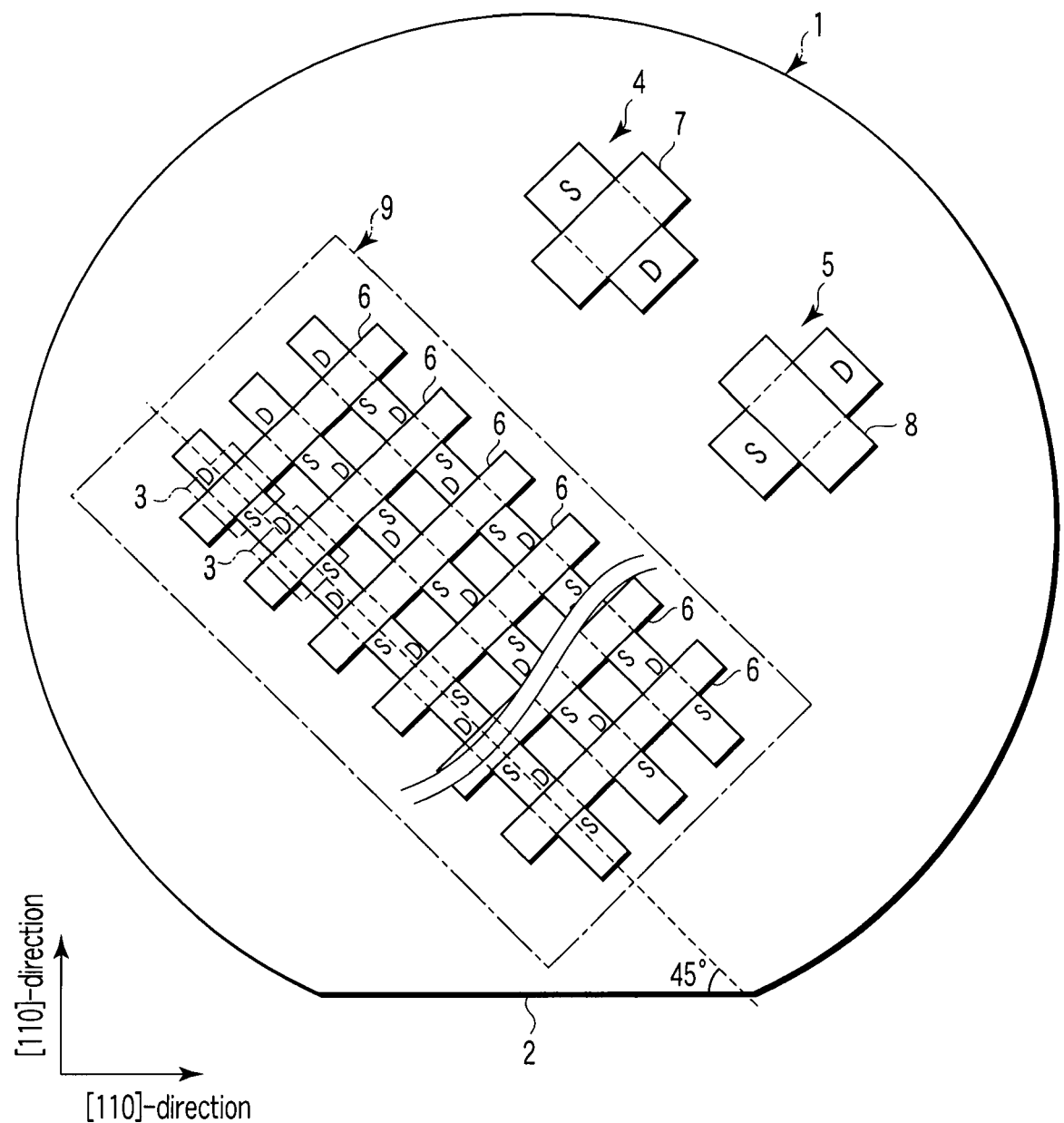
FIG. 6 is a plan view showing a semiconductor wafer with a semiconductor storage device formed thereon, according to a second modification of the first embodiment of the present invention.
Figure 7:
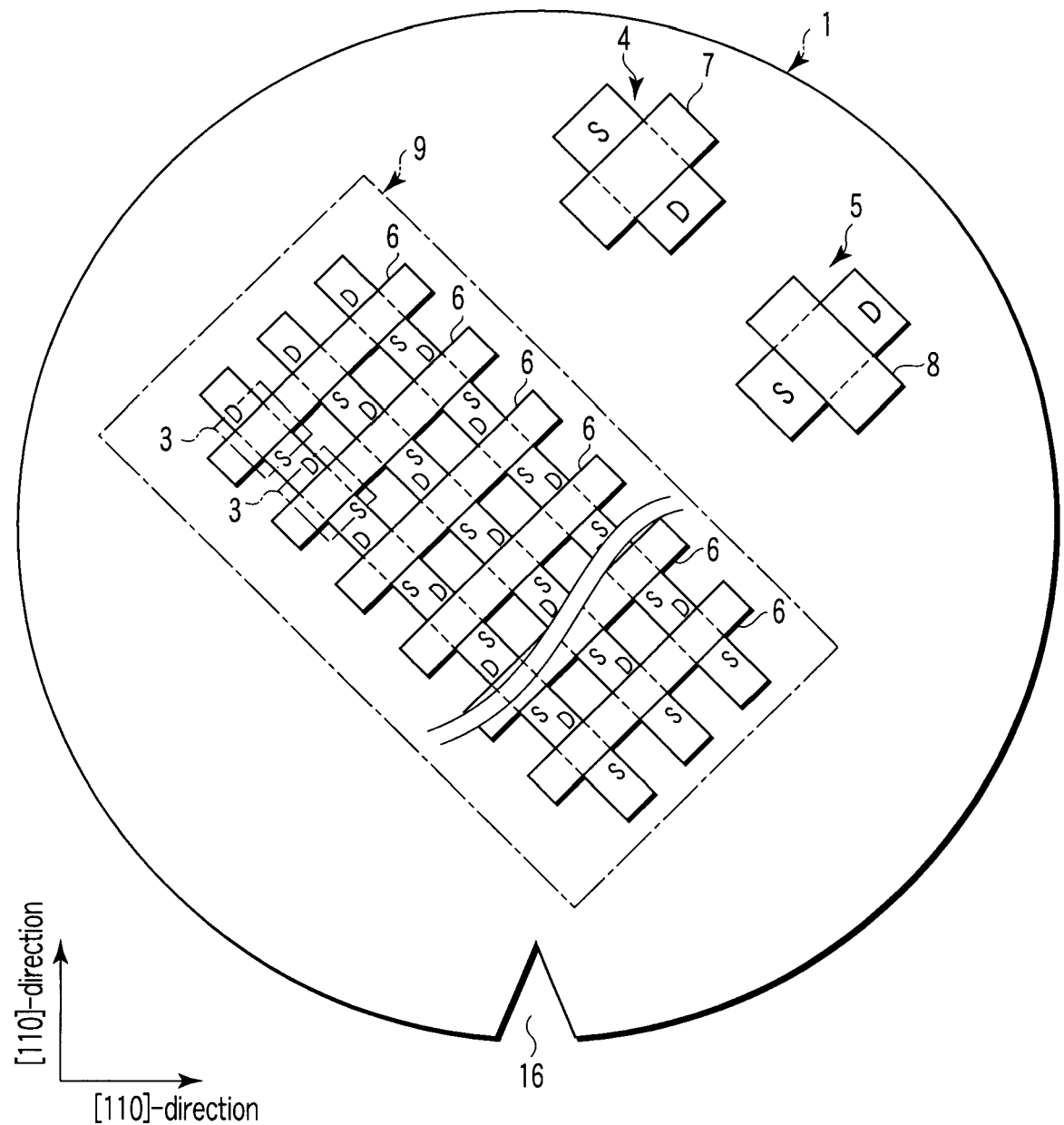
FIG. 7 is a plan view showing a semiconductor wafer with a semiconductor storage device formed thereon, according to a third modification of the first embodiment of the present invention.

Further, the orientation flat 2 may be set parallel to the [110]-direction, as in the position conventionally used. An example of such a case is shown in FIG. 6. FIG. 6 is a plan view showing a semiconductor wafer 1 according to a modification of this embodiment. As shown in FIG. 6, each of the memory cells 3 and p-type MISFETs 4 and 5 is arranged such that the channel length direction is inclined by 45° relative to the orientation flat 2. Also in this arrangement, each of the memory cells 3 and p-type MISFETs 4 and 5 is arranged such that the channel length direction is parallel to the [100]-direction or [010]-direction, thereby providing the same effect. This same is true also in a case shown in the plan view of FIG. 7, in which a notch 16 is formed in place of the orientation flat 2. The direction of the orientation flat 2 shown in FIG. 1 or the direction of the notch 16 shown in FIG. 5 can be easily prepared by rotating a conventionally used wafer by 45°.

Figure 8:
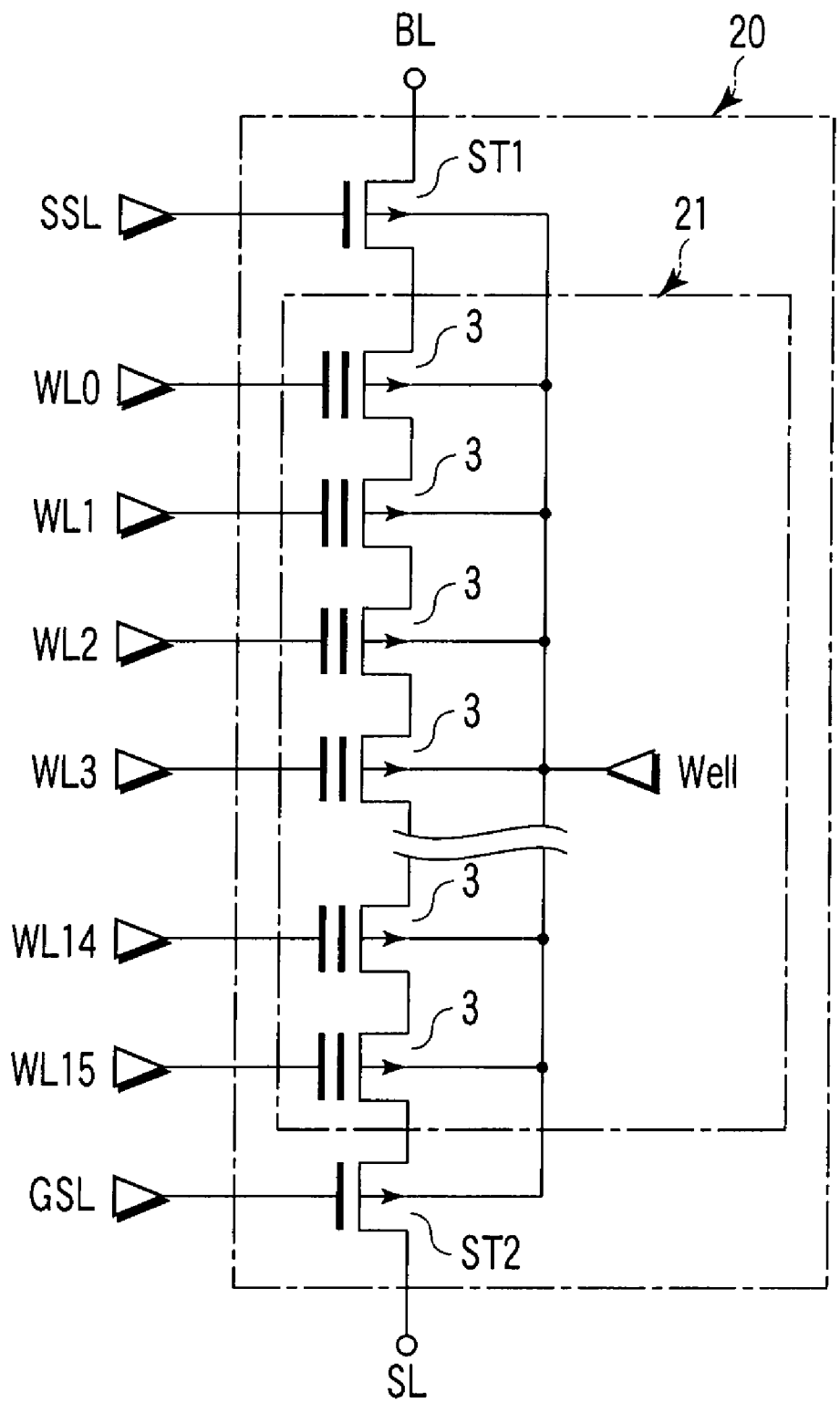
FIG. 8 is an equivalent circuit diagram showing a NAND cell in a semiconductor storage device according to the first embodiment of the present invention.

The explanation described above is given of a NAND-type EEPROM with reference to schematic views. Next, a detail explanation will be given of the memory cell array of a NAND-type EEPROM according to this embodiment. FIG. 8 is an equivalent circuit diagram showing a NAND cell in a NAND-type EEPROM.

As shown in FIG. 8, the NAND cell 20 includes 16 memory cells 3 respectively formed of n-type MISFETs each including a charge storage layer, and selection transistors ST1 and ST2. The current passages of the memory cells 3 are connected to each other in series. The drain at one end of this series connection is connected to a data transfer line BL through the current passage of the selection transistor ST1. The source at the other end is connected to a common source line SL through the current passage of the selection transistor ST2. The memory cells 3 and selection transistors ST1 and ST2 are formed on a common p-type well. The control gate electrodes of the memory cells 3 are respectively connected to data selection lines WL0 to WL15. The gates of the selection transistors ST1 and ST2 are respectively connected to block selection lines SSL and GSL. In the arrangement described above, the group of the 16 memory cells 3 forms a memory cell block 21, and the selection transistors ST1 and ST2 are used for selection of the memory cell block 21. In FIGS. 1 and 5 to 7 described previously, only the memory cell block 21 is shown while the selection transistors ST1 and ST2 are not shown.

In the memory cell array 9 of the NAND-type EEPROM, NAND cells 20 each having the arrangement described above are arrayed in a matrix format. The NAND cells 20 in the same column are arranged to use the drain of a selection transistor ST1 or the source of a selection transistor ST2 in common between an adjacent two of them. The drains of the selection transistors ST1 in the same column are connected to a common data transfer line BL. The memory cells 3 and selection transistors ST1 and ST2 in the same row are connected to common data selection lines and common block selection lines.

In the arrangement according to this embodiment, each of the selection transistors ST1 and ST2 has a charge storage layer as in the memory cells 3, and the control lines SSL and GSL are formed from the same layer as the data selection lines WL0 to WL15. It is necessary for each NAND cell 20 to include at least one selection transistor ST1 and at least one selection transistor ST2. Accordingly, for example, each NAND cell 20 may include two or more selection transistors ST1 and two or more selection transistors ST2. The block selection lines SSL and GSL are preferably formed in the same direction as the data selection lines WL0 to WL15 in light of a higher density. FIG. 8 shows a case where the number of the memory cell 3 is $2^4=16$. However, the number of memory cells connected to the data transfer lines and data selection lines is only required to be plural, and is preferably set to be $2^n$ (n is a positive integer) in light of address decoding.

Figure 9:
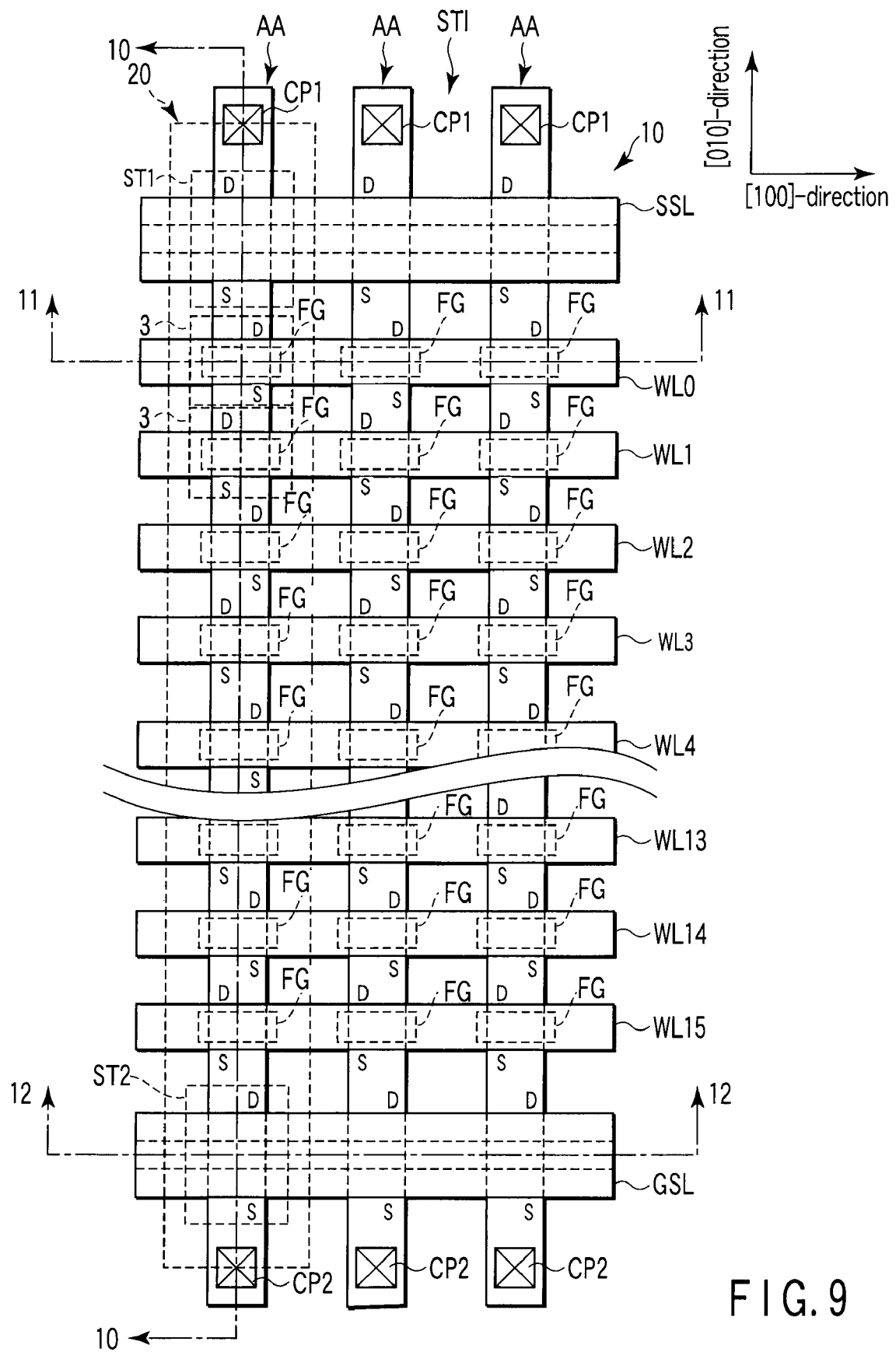
FIG. 9 is a plan view showing a NAND cell in a semiconductor storage device according to the first embodiment of the present invention.

FIG. 9 is a plan view showing a memory cell array 9 in a NAND-type EEPROM according to this embodiment, and shows an area where three NAND cells 20 are arrayed in a data selection line direction.

As shown in FIG. 9, active areas AA having a longitudinal direction in the [010]-direction of a semiconductor wafer 1 are arrayed in the [100]-direction in a p-type well region 10. A device isolation area STI is formed between an adjacent two of the active areas AA to electrically isolate the active areas AA by the device isolation area STI. Data selection lines WL0 to WL15 and block selection lines SSL and GSL are formed over the active areas AA to have a longitudinal direction in the [100]-direction and to bridge the active areas AA. Floating gate electrodes FG are respectively formed at regions where the data selection lines WL0 to WL15 intersect with the active areas AA. Further, sources and drains are formed in the active areas AA. In FIG. 9, the regions indicated by "S" and "D" are regions in which a source and a drain are formed, respectively. Every two memory cells 3 adjacent to each other in the [010]-direction are arranged to use the same impurity diffusion layer in common as the source of one of them and the drain of the other. The source of each selection transistor ST1 and the drain of the memory cell 3 closest to the selection transistor ST1 use an impurity diffusion layer in common. Further, the drain of each selection transistor ST2 and the source of the memory cell 3 closest to the selection transistor ST2 use an impurity diffusion layer in common. A contact plug CP1 is formed on the drain of each selection transistor ST1, while a contact plug CP2 is formed on the source of each selection transistor ST2. The contact plug CP1 is connected to a data transfer line BL (not shown), while the contact plug CP2 is connected to a source line SL (not shown).

Figure 10:
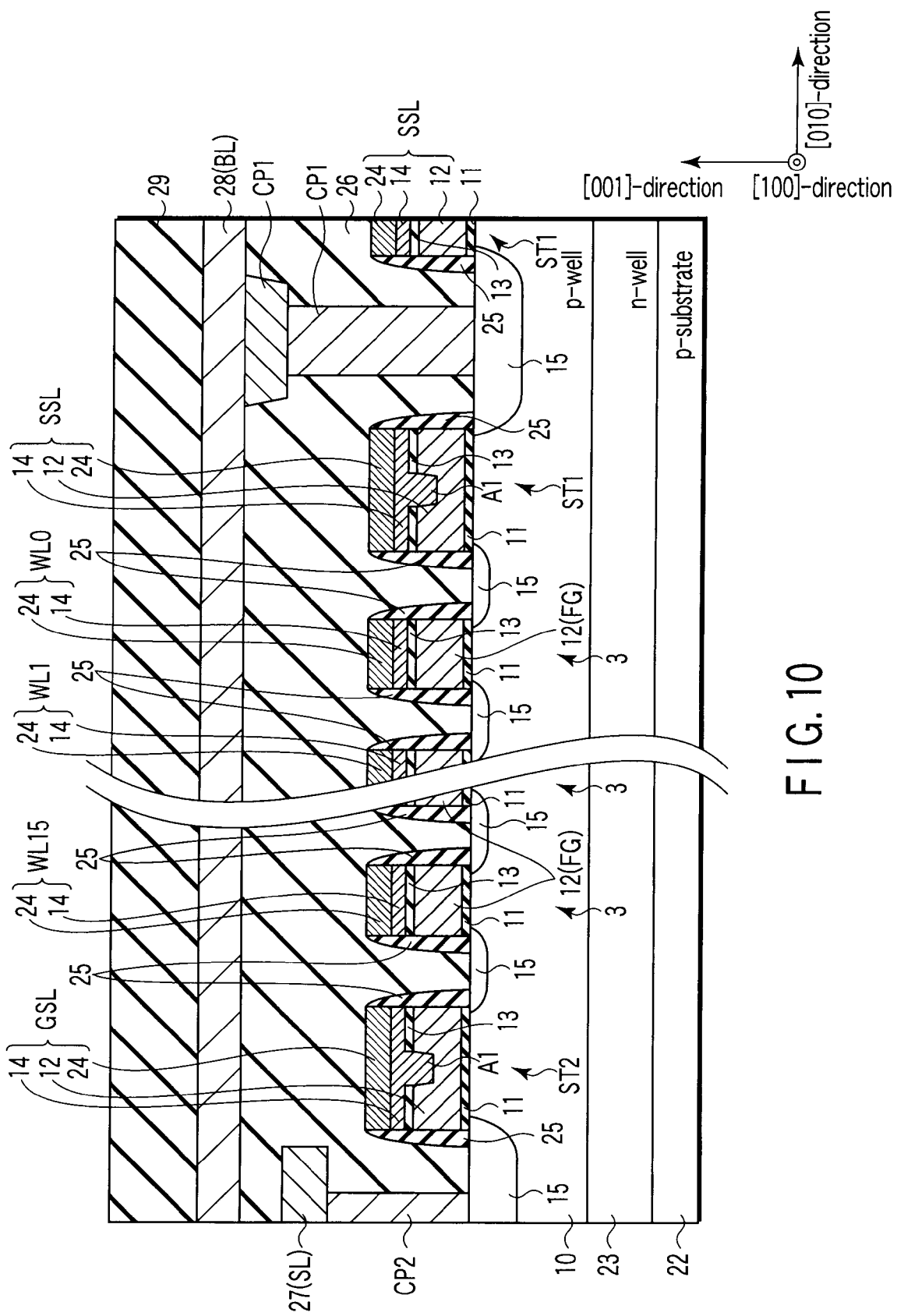
FIG. 10 is a sectional view taken along a line 10-10 in FIG. 9.
Figure 11:
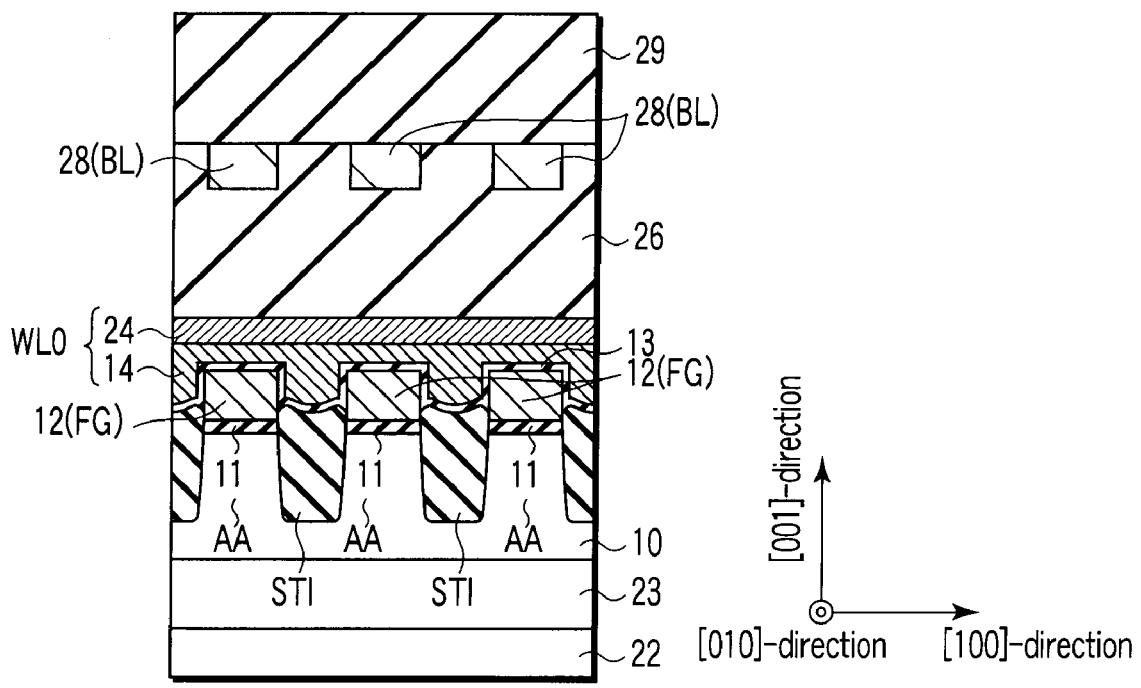
FIG. 11 is a sectional view taken along a line 11-11 in FIG. 9.
Figure 12:
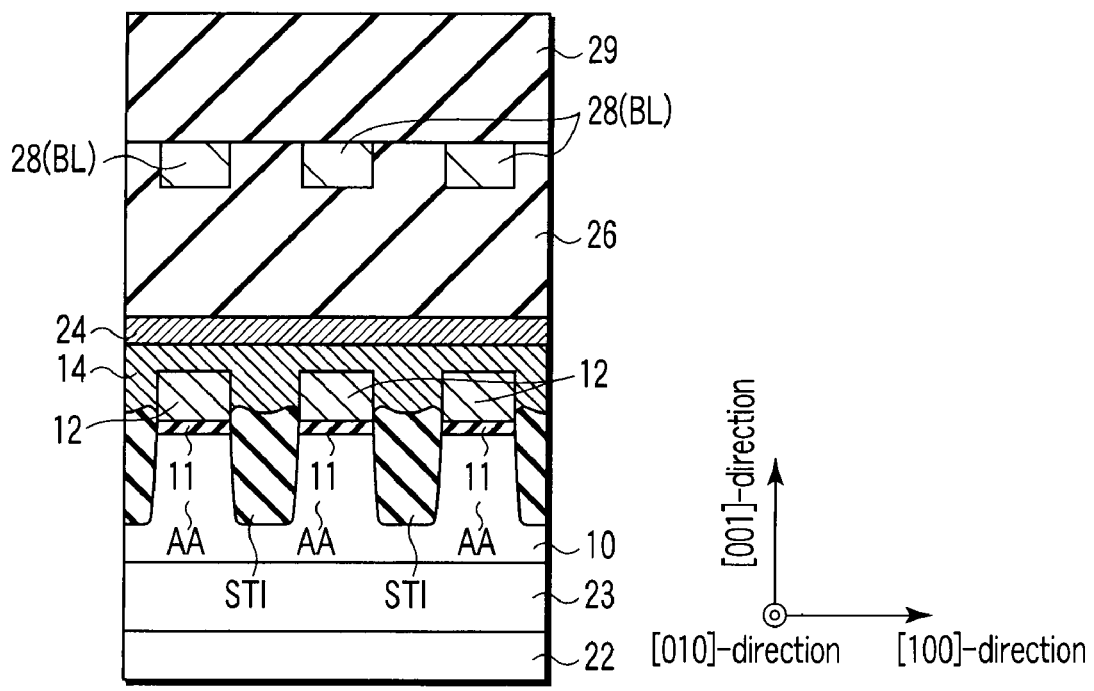
FIG. 12 is a sectional view taken along a line 12-12 in FIG. 9.

Next, an explanation will be given of the sectional arrangement of each NAND cell 20 having the structure described above, with reference to FIGS. 10 to 12. FIG. 10 is a sectional view taken along a line 10-10 in FIG. 9. FIG. 11 is a sectional view taken along a line 11-11 in FIG. 9. FIG. 12 is a sectional view taken along a line 12-12 in FIG. 9. In these drawings, constituent elements corresponding to the same elements shown in the sectional view of FIG. 2 are denoted by the same reference numerals.

As shown in FIGS. 10 to 12, an n-type well 23 is formed in a surface area of a p-type silicon substrate 22, and a p-type well 10 is formed in a surface area of the n-type well 23. For example, the p-type well 10 contains boron as an impurity at an impurity concentration of, e.g., $10^{14}$ cm$^{-3}$ to $10^{19}$ cm$^{-3}$. In the p-type well 10, a plurality of device isolation areas STI are formed such that each active area AA is defined between an adjacent two of the device isolation areas STI. Each device isolation area STI is formed to have an upper surface higher than the upper surface of the p-type well 10. The p-type well 10 is electrically isolated from the silicon substrate by the n-type well 23, so that a voltage can be applied thereto independently of the silicon substrate 22. This arrangement allows the boosting circuit to be less loaded in erasing, thereby decreasing the power consumption.

On each active area AA, an insulating film 11 is formed to have a film thickness of, e.g., 3 nm to 15 nm. The insulating film 11 serves as a gate insulating film of each of the memory cells 3 and selection transistors ST1 and ST2. For example, the insulating film 11 is formed of a silicon oxide film or oxynitride film. On the gate insulating film 11, a poly-crystalline silicon layer 12 doped with phosphorous or arsenic at a concentration of $10^{18}$ cm$^{-3}$ to $10^{21}$ cm$^{-3}$ is formed to have a thickness of 10 nm to 500 nm. The poly-crystalline silicon layer 12 serves as a floating gate electrode FG in each memory cell 3, and serves as a part of block selection lines SSL and GSL in the selection transistors ST1 and ST2. The insulating film 11 and poly-crystalline silicon layer 12 are formed in a self-alignment manner relative to each active area AA. Specifically, they are formed, as follows. For example, at first, the insulating film 11 and poly-crystalline silicon layer 12 are deposited on the p-type well 10. Then, the insulating film 11 and poly-crystalline silicon layer 12 are subjected to patterning. At this time, not only the insulating film 11 and poly-crystalline silicon layer 12, but also the p-type well 10 is sequentially etched by a depth of, e.g., 0.05 μm to 0.5 μm. Then, the recess thus formed in the p-type well 10 is filled with an insulating film. According to this method, the underlying layer on which the insulating film 11 and poly-crystalline silicon layer 12 are to be formed is flat without step portions. Consequently, each of the insulating film 11 and poly-crystalline silicon layer 12 can be formed with improved uniformity and uniform properties.

On the poly-crystalline silicon layer 12, an inter-gate insulating film 13 is formed to have a film thickness of, e.g., about 5 nm to 30 nm. The inter-gate insulating film 13 is formed of, e.g., a silicon oxide film, an oxynitride film, or a multi-layered structure of a silicon oxide film/a silicon nitride film/a silicon oxide film. On the inter-gate insulating film 13, a poly-crystalline silicon layer 14 doped with, e.g., phosphorous, arsenic, or boron at a concentration of $10^{17}$ cm$^{-3}$ to $10^{21}$ cm$^{-3}$ is formed to have a film thickness of 10 nm to 500 nm. On the poly-crystalline silicon layer 14, a silicide layer 24, such as WSi (tungsten silicide) is formed. The silicide layer 24 may be made of NiSi, MoSi, TiSi, of CoSi in place of WSi. The poly-crystalline silicon layer 14 and silicide layer 24 serve as data selection lines WL0 to WL15 in each memory cell 3. In each of the selection transistors ST1 and ST2, a part of the inter-gate insulating film 13 is removed at an area A1, so that the poly-crystalline silicon layers 12 and 14 and the silicide layer 24 are connected to each other. Accordingly, the poly-crystalline silicon layer 14 and silicide layer 24 serve as a part of the block selection lines SSL and GSL, as in the poly-crystalline silicon layer 12.

In the arrangement according to this embodiment, when the stacked gates (word lines) are formed, the device isolation areas STI have already been formed. Accordingly, the poly-crystalline silicon layer 14 is formed at a position higher than the surface of the p-type well 10. In this case, it is possible to suppress concentration of the gate electric field at the boundary between the p-type well 10 and device isolation areas STI and to suppress formation of a parasitic transistor with a lower threshold. Further, since a decrease in writing threshold or a so-called sidewalk phenomenon due to an electric field concentration is hardly caused, it is possible to form a transistor with higher reliability.

On the sidewall of each stacked gate including the poly-crystalline silicon layer 12 and 14 and the silicide layer 24, a sidewall insulating film made of a silicon nitride film or silicon oxide film is formed to have a thickness of, e.g., 5 nm to 200 nm. On the both sides of each stacked gate, n-type impurity diffusion layers 15 servings as the source or drain are formed in the p-type well 10. As described previously, the direction from the source to the drain is parallel to the [010]-direction or [100]-direction of the wafer 1. An EEPROM cell 3 of the floating gate type is structured by the diffusion layers 15, the poly-crystalline silicon layers 12 and 14, and so forth such that the amount of electrical charge stored in the poly-crystalline silicon layer 12 correspond to the data. This structure has a gate length of, e.g., 0.5 μm or less and 0.01 μm or more. The impurity diffusion layers 15 of each memory cell 3 is formed to contain, e.g., phosphorous, arsenic, or antimony at a surface concentration of $10^{17}$ cm$^{-3}$ to $10^{21}$ cm$^{-3}$, and to have a depth of 10 nm to 500 nm. The diffusion layers 15 are used by adjacent memory cells 3 in common to realize NAND connection. The poly-crystalline silicon layers 12 and 14 of the selection transistors ST1 and ST2 of each memory cell 3 are formed from the same layer as the poly-crystalline silicon layers 12 and 14 of the other memory cells 3. The gate length of the selection transistors ST1 and ST2 is larger than the gate length of the memory cells 3, and is set to be, e.g., 1 μm or less and 0.02 μm or more. With this arrangement, the on/off ratio between selection and non-selection of the memory cell block 21 is increased, so that program disturbance and read disturbance are prevented.

On the p-type well 10, an inter-level insulating film 26 is formed to cover the memory cells 3 and selection transistors ST1 and ST2. The inter-level insulating film 26 is made of a material, such as SiO$_2$ or SiN. The inter-level insulating film 26 envelops contact plugs CP1 and CP2 formed therein and respectively connected to the drain of the selection transistor ST1 and the source of selection transistor ST2. Further, metal interconnection layers 27 and 28 are respectively formed in and on the inter-level insulating film 26, wherein the metal interconnection layer 27 is connected to the contact plug CP2 and serves as a source line SL, and the metal interconnection layer 28 is connected to the contact plug CP1 and serves as a data transfer line BL. The metal interconnection layers 27 and 28 are made of a material, such as tungsten, tungsten silicide, titanium, titanium nitride, or aluminum. The data transfer line 28 (BL) is formed as a stripe shape extending in the [010]-direction, and is connected to the NAND cells 20 in the same column in common. On the other hand, the source line 27 (SL) is formed as a stripe shape extending in the [100]-direction, and is connected to the NAND cells 20 in the same row in common.

In place of the metal interconnection layer 27, the source line SL may be formed of an impurity diffusion layer 15, which is formed to extend in the [100]-direction and serves as the source of the selection transistor ST2. The contact plugs CP1 and CP2 are made of a conductive material, such as poly-crystalline silicon doped with an n-type or p-type impurity, tungsten, tungsten silicide, Al, TiN, or Ti.

On the inter-level insulating film 26, an insulating film protection layer 29 is formed to cover the metal interconnection layer 28. The insulating film protection layer 29 is made of a material, such as SiO$_2$, SiN, or polyimide. Further, although not shown, an upper interconnection layer made of a material, such as W, Al, or Cu, is formed on the insulating film protection layer 29.

Figure 13:
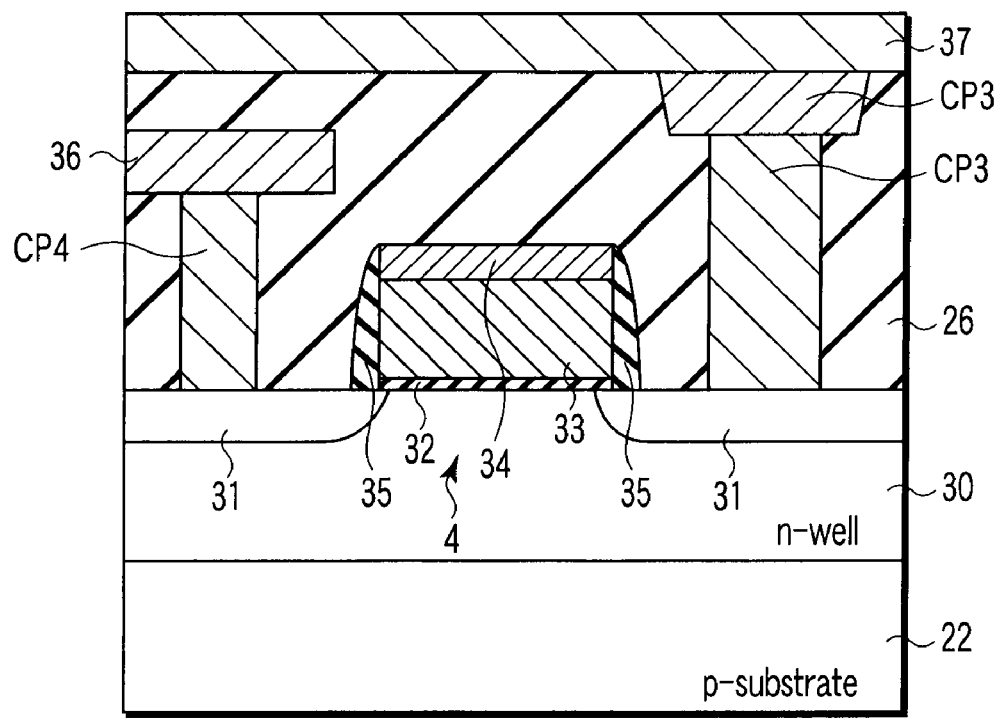
FIG. 13 is a sectional view showing a p-type MISFET built in a semiconductor storage device according to the first embodiment of the present invention.
Figure 13:
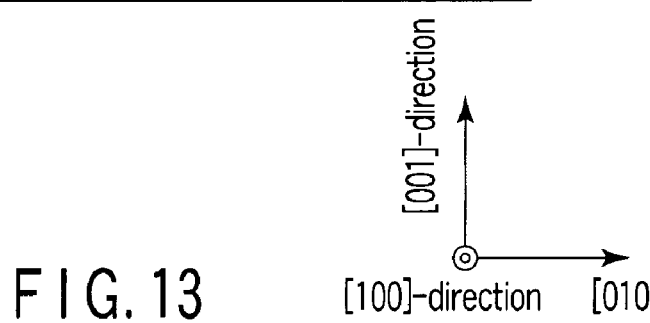

FIG. 13 is a sectional view showing a p-type MISFET 4 in the channel length direction. As shown in FIG. 13, an n-type well 30 is formed in a surface area of the p-type silicon substrate 22. P-type impurity diffusion layers 31 are formed separately from each other in a surface area of the n-type well 30. The impurity diffusion layers 31 serve as the source or drain of the p-type MISFET 4. A gate electrode (corresponding to the gate 7 shown in FIGS. 1 and 5 to 7) is formed through a gate insulating film 32 on the well 30 between the adjacent impurity diffusion layers 31. The gate electrode includes a poly-crystalline silicon layer 33 formed on the gate insulating film 32 and a silicide layer 34 formed on the poly-crystalline silicon layer 33. The p-type MISFET 4 is structured by the impurity diffusion layers 31, the gate electrode, and so forth. The direction from the source to the drain is parallel to the [010]-direction of the wafer 1. On the sidewall of the gate electrode, a sidewall insulating film 35 is formed. The inter-level insulating film 26 is formed to cover the p-type MISFET 4 on the well 30. The inter-level insulating film 26 envelops contact plugs CP3 and CP4 formed therein and respectively connected to the drain and source. The contact plugs CP3 and CP4 are respectively connected to metal interconnection layers 37 and 36. The p-type MISFET 5 may have the same arrangement as the MISFET 4 except that the direction from the source to the drain is parallel to the [100]-direction.

SECOND EMBODIMENT

Figure 14:
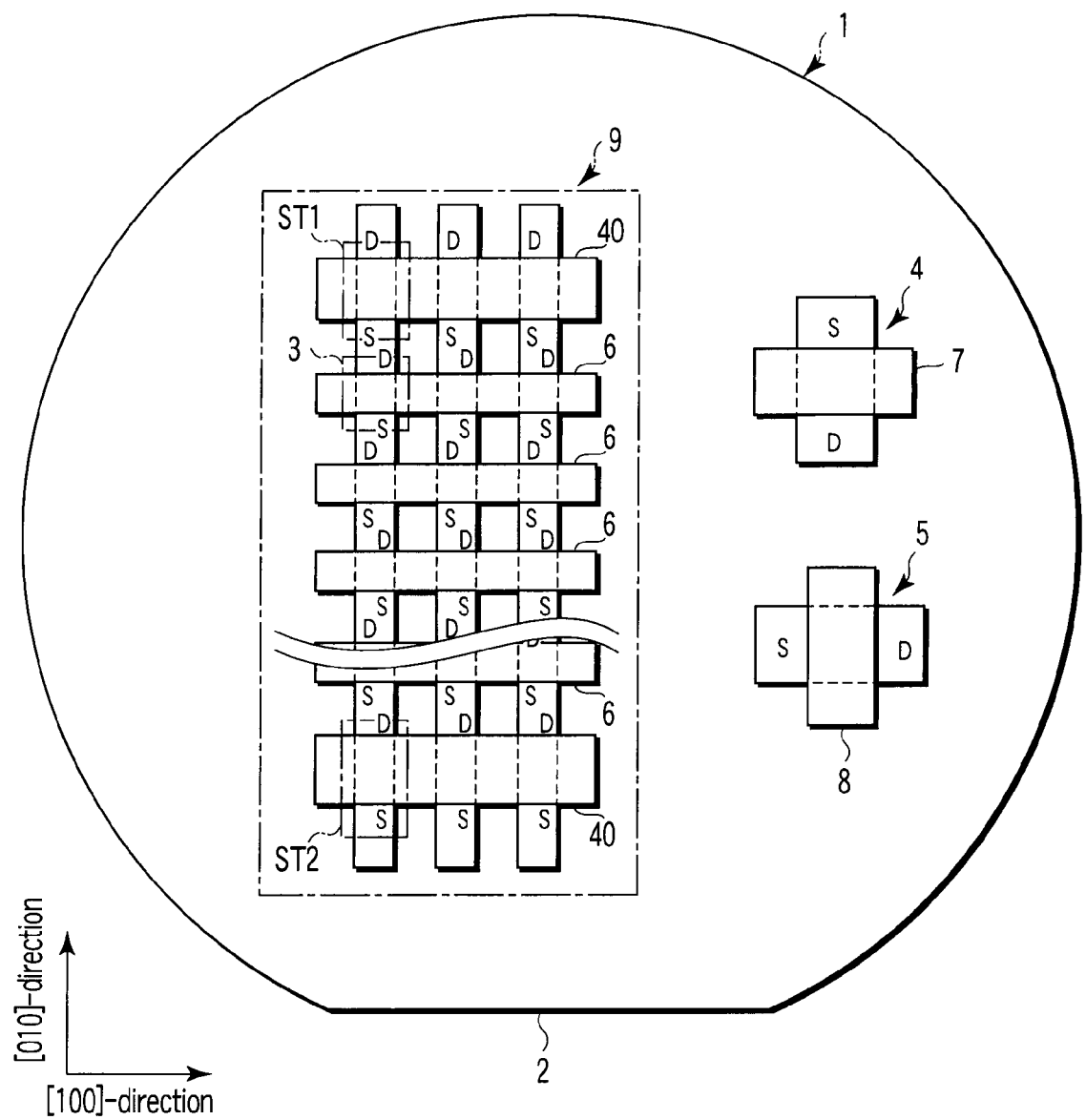
FIG. 14 is a plan view showing a semiconductor wafer with a semiconductor storage device formed thereon, according to a second embodiment of the present invention.

Next, an explanation will be given of a semiconductor storage device according to a second embodiment of the present invention. This embodiment relates to placement of the selection transistors in the first embodiment. FIG. 14 is a plan view showing a semiconductor wafer with a semiconductor storage device formed thereon, according to this embodiment, and schematically showing the placement of transistors on the wafer. In the drawings, the regions indicated by "S" and "D" are regions in which the source and drain of a transistor are formed, respectively.

In FIG. 14, the main surface of a semiconductor wafer 1 is defined by the (001)-plane. The wafer 1 has an orientation flat 2 on the peripheral edge. The orientation flat 2 is set parallel to the [100]-direction of the wafer 1. Accordingly, the direction perpendicular to the orientation flat 2 is parallel to the [010]-direction on the surface of the wafer 1.

The main surface of the semiconductor wafer 1 is provided with a memory cell array 9 and p-type MISFETs 4 and 5, formed thereon for a NAND-type EEPROM. Since these members have the same arrangement as that explained in the first embodiment, their explanation will be omitted. In this embodiment, the memory cells 3, selection transistors ST1 and ST2, and p-type MISFET 4 are arranged such that the direction from the source to the drain, i.e., channel length direction, is parallel to the [010]-direction of the wafer 1. In other words, the gate electrodes 6 and 7 and the gate electrodes 40 of the selection transistors ST1 and ST2 have a gate width direction parallel to the [100]-direction. The memory cells 3 as well as the selection transistors ST1 and ST2 may be arranged such that, in place of the [010]-direction, the direction from the source to the drain is set parallel to a direction equivalent thereto, such as the [100]-direction, based on crystallography. As described previously, it should be noted that the "gate width direction" is the same as the channel width direction, which is perpendicular to the channel length direction. In other words, this direction is perpendicular to the direction in which the source, channel, and drain are arrayed.

The arrangement described above provides the following effect (3) in addition to the effects (1) and (2) explained in the first embodiment.

(3) The operational reliability of a NAND-type EEPROM is improved (a second issue).

In the arrangement according to this embodiment, each of the selection transistors ST1 and ST2 as well as the memory cells 3 is formed on the (001)-plane of the semiconductor wafer 1 such that the direction from the source to the drain is parallel to the [010]-direction or [100]-direction (or a direction equivalent thereto). In this case, the lifetime of hot carrier injection can be prolonged in the selection transistors ST1 and ST2. Consequently, it is possible to prevent operation disturbance from being caused in the NAND-type EEPROM. This effect will be explained in detail below.

At first, the mechanism of an operation disturbance being caused by hot carrier injection will be explained, with reference to FIG. 15. FIG. 15 is a sectional view showing a part of the memory cell array of a NAND-type EEPROM, and showing two memory cells 3 and a selection transistor ST2. For the sake of simplicity in explanation, the memory cells 3 are named memory cells 3-4 and 3-5 in this order from the source line SL side. As an example, the following explanation will be given of a case where writing is performed to select the memory cell 3-4 and write data to the memory cell 3-4.

In data writing, the control gate electrode 14 of the selection transistor ST2 is supplied with a voltage, such as 0V, which is lower than the threshold voltage of the selection transistor ST2. Further, the control gate electrode 14 of the selected memory cell 3-4 is supplied with a voltage, such as 4V or more and 30V or less, which is higher than the threshold voltage Vth of the selected memory cell 3-4. In general, a NAND-type flash memory is arranged such that the gate of each memory cell is supplied with a voltage higher than the voltage applied to the gate of the selection transistor ST2 to prevent electrons or holes from being injected into the gate insulating film 11 of the selection transistor ST2.

At this time, the electric potential of the impurity diffusion layer 15 used in common by the selection transistor ST2 and the memory cell 3-4 adjacent thereto is increased to a voltage of, e.g., 4V or more, due to the capacitive coupling with the control gate electrode 14 of the memory cell. Then, since the gate electric potential of the selection transistor ST2 is set at 0V, electrons are generated due to gate-induced drain leakage (GIDL) in the impurity diffusion layer 15 used in common by the selection transistor ST2 and the memory cell 3-4 adjacent thereto. The electrons thus generated act as hot electrons, which are injected into the floating gate electrode 12 or gate insulating film 11 of the memory cell 3-4 adjacent to the selection transistor ST2. Where hot electrons are injected into the floating gate electrode 12, the electrons are accumulated in the floating gate electrode 12, and the problem of program disturbance may be thereby caused. Where hot electrons are injected into the gate insulating film 11 and trapped there, the threshold voltage of this memory cell is increased, and an operation disturbance may be thereby caused.

In light of this phenomenon, the arrangement according to this embodiment is designed such that the direction from the source to the drain in each memory cell is parallel to the [100]-direction or [010]-direction. In this case, as explained in the first embodiment, the lifetime of hot carrier injection becomes about 1.5 times larger than the conventional value. Consequently, writing can be performed while program disturbance of data to the memory cell 3 and trapping of electrons in the gate insulating film 11 are effectively prevented. Accordingly, this embodiment makes it possible to improve the program disturbance of a NAND-type EEPROM and thereby to improve the operational reliability of the NAND-type EEPROM. As explained in the first embodiment with reference to the effect (1), the effect (3) is also peculiar to semiconductor memories arranged to write data by FN tunneling.

Figure 16:
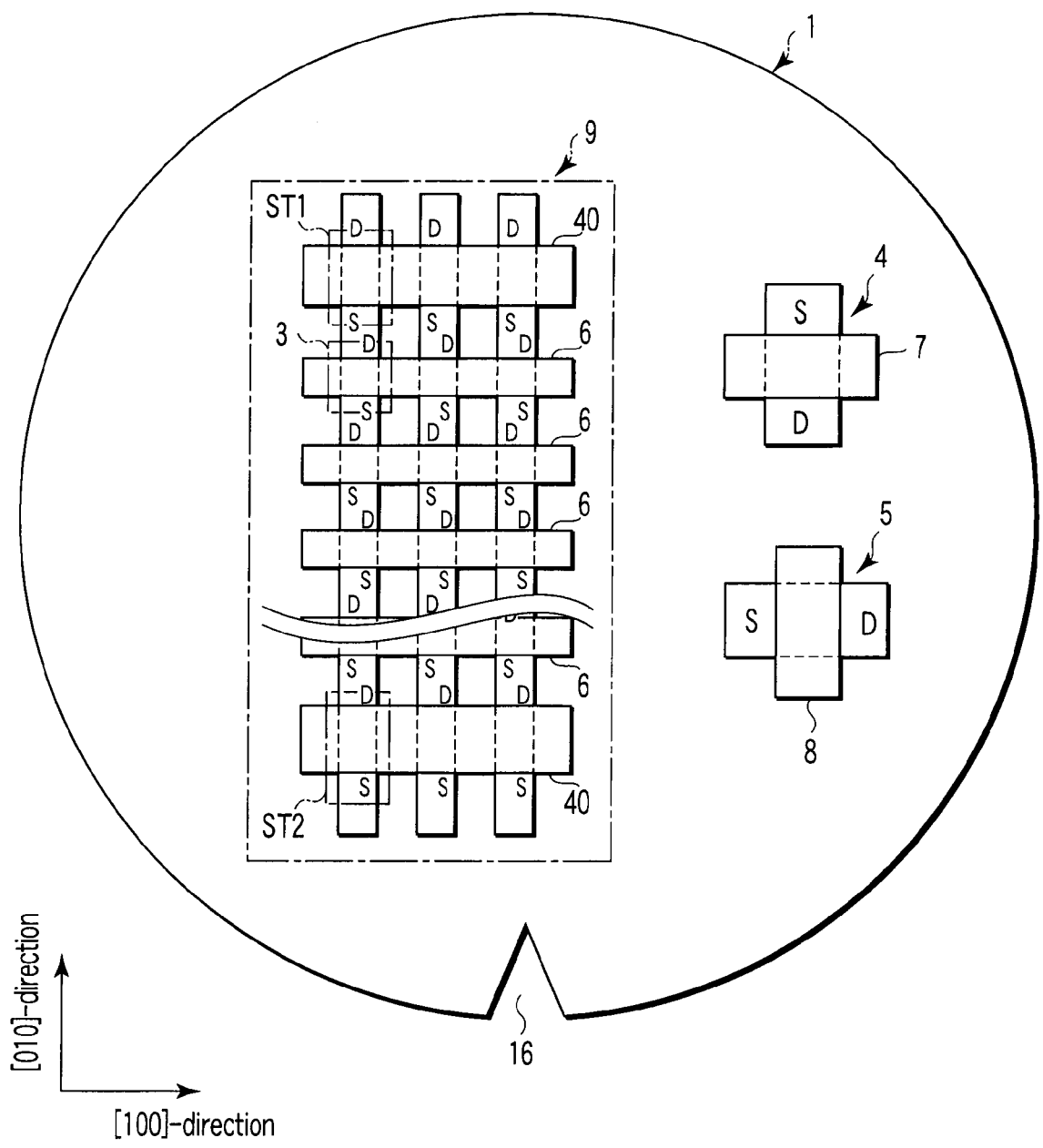
FIG. 16 is a plan view showing a semiconductor wafer with a semiconductor storage device formed thereon, according to a first modification of the second embodiment of the present invention.

In this embodiment, it suffices if each MISFET is arranged such that the direction from the source to the drain is parallel to the [100]-direction or [010]-direction, as in the first embodiment. Accordingly, as shown in the plan view of FIG. 16, this embodiment may be applied to a semiconductor wafer 1 having a notch 16 in place of the orientation flat 2.

Figure 18:
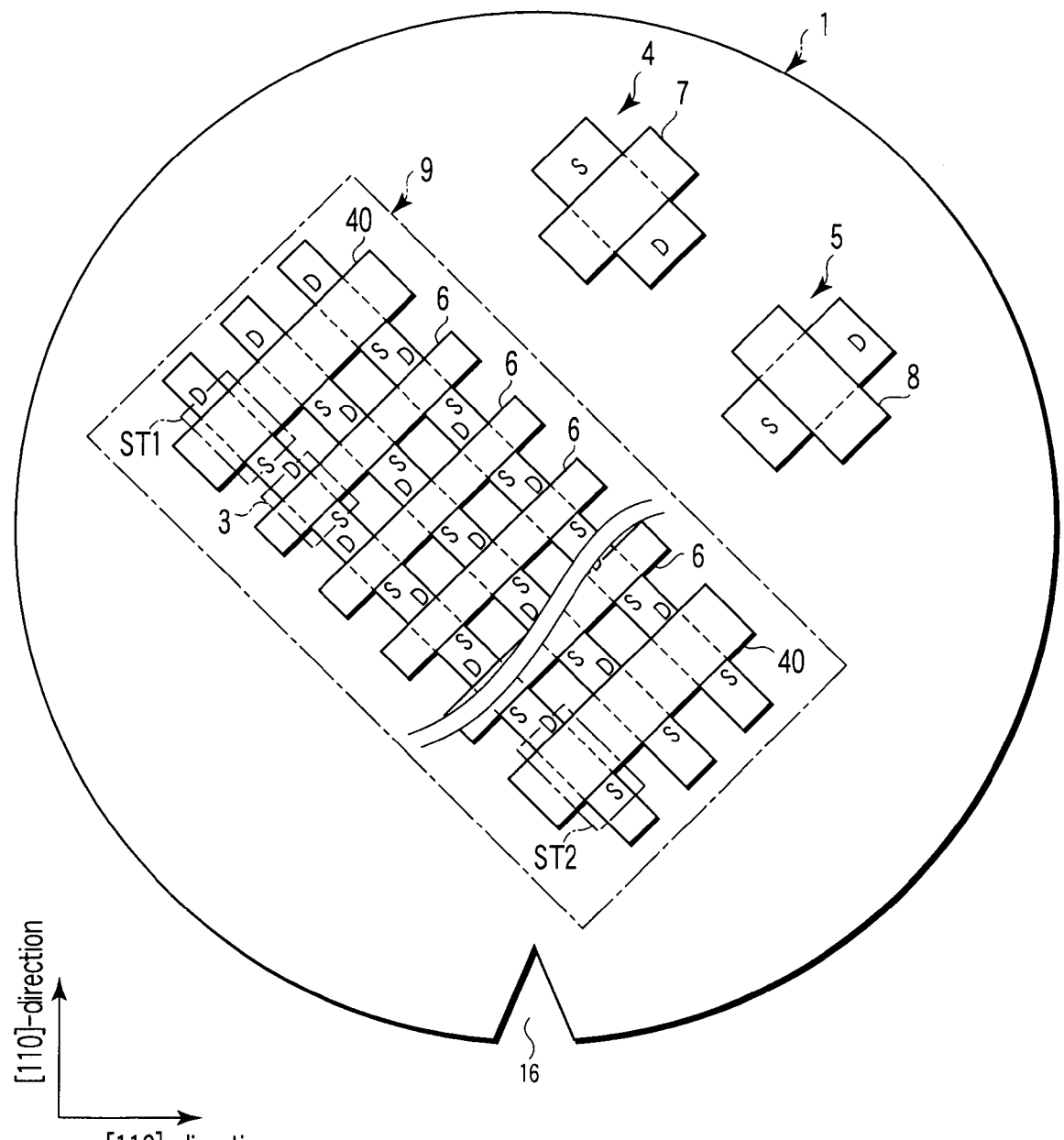
FIG. 18 is a plan view showing a semiconductor wafer with a semiconductor storage device formed thereon, according to a third modification of the second embodiment of the present invention.

Further, the orientation flat 2 may be set parallel to the [110]-direction, as in the position conventionally used. An example of such a case is shown in FIG. 17. FIG. 17 is a plan view showing a semiconductor wafer 1 according to a modification of this embodiment. As shown in FIG. 17, each of the memory cells 3, selection transistors ST1 and ST2, and p-type MISFETs 4 and 5 is arranged such that the channel length direction is inclined by 45° relative to the orientation flat 2. Also in this arrangement, each of the memory cells 3, selection transistors ST1 and ST2, and p-type MISFETs 4 and 5 is arranged such that the channel length direction is parallel to the [100]-direction or [010]-direction, thereby providing the same effect. This same is true also in a case shown in the plan view of FIG. 18, in which a notch 16 is formed in place of the orientation flat 2. The direction of the orientation flat 2 shown in FIG. 14 or the direction of the notch 16 shown in FIG. 16 can be easily prepared by rotating a conventionally used wafer by 45°.

As described above, the semiconductor storage device according to each of the first and second embodiments of the present invention includes memory cells and MISFETs each arranged such the direction from the source region to the drain region has been changed from the [110]-direction conventionally used to the [100]-direction or [010]-direction. Consequently, it is possible to suppress generation of hot carriers and to solve problems concerning operation disturbance, thereby improving the operational reliability of a NAND-type EEPROM.

In the embodiments described above, the memory cells and MISFETs are exemplified by a case where they are formed on a semiconductor substrate having a main surface defined by the (001)-plane. However, it is not necessarily required to form the memory cells and p-type MISFETs on the (001)-plane in the strict sense. For example, even where an off-flat substrate is used, the effect described above can be provided by transistors formed on a surface essentially defined by the (001)-plane.

In the first and second embodiments described above, the channel length direction of a memory cell is preferably aligned with the channel length direction of a p-type MISFET. With this arrangement, the length of an interconnection line connecting them can be shorter, so that the semiconductor device can be arranged with a high density.

Where a semiconductor single-crystal substrate is used as the substrate 22, the boundary of a device isolation area STI shows some dependency on the crystal axis direction, in etching for forming the device isolation area STI. Accordingly, where the channel length direction of a memory cell is aligned with the channel length direction of a p-type MISFET, etched shapes can be uniform, so that the junction breakdown voltage and/or device isolation embedded shape can be advantageously uniform. As a matter of course, where a substrate having a crystal lattice of the Zinc blende structure or Diamond structure type as a semiconductor single-crystal is used, the channel length directions of a memory cell and a p-type MISFET may be shifted from each other by 90°. In this case, since they are parallel to directions having the same symmetry, etched shapes can be uniform so that the junction breakdown voltage and/or device isolation embedded shape can be advantageously uniform.

Further, in the embodiments described above, the NAND-type memory cell is exemplified by a structure that uses the floating gate electrode 12 as the charge storage layer. However, the charge storage layer may be formed of an insulating film, such as a silicon nitride film, silicon oxynitride film, $Al_2O_3$, $HfAlO_x$, $HfSiO_x$, or a combination thereof.

The insulating films in the device isolation areas STI and other insulating films may be formed by changing silicon into a silicon oxide film or silicon nitride film. Alternatively, a method for implanting, e.g., oxygen ions into deposited silicon or a method for oxidizing deposited silicon may be used. Further, in the embodiments described above, a p-type silicon substrate is used as the semiconductor substrate 22. However, an n-type silicon substrate or silicon-on-insulator (SOI) substrate may be used, or another single-crystal semiconductor substrate containing silicon, such as SiGe mix crystal or SiGeC mix crystal, may be used. Further, the poly-crystalline silicon layer 14 serving as the control gate electrode of each memory cell 3 or the gate electrode of each of the selection transistors ST1 and ST2 may be made of a silicide or polycide, such as SiGe mix crystal, SiGeC mix crystal, TiSi, NiSi, CoSi, TaSi, WSi, or MoSi, or a metal, such as Ti, Al, Cu, TiN, or W. The layer 14 may be made of poly-crystalline or may have a multi-layered structure of the materials described above. Further, the gate electrode 15 may be made of amorphous Si, amorphous SiGe, or amorphous SiGeC, or may have a multi-layered structure of these materials.

In the first and second embodiments described above, a NAND-type EEPROM is explained as an example. However, as described previously, the embodiment may be widely used for flash memories arranged to write data by FN tunneling, other than the NAND-type EEPROM.

Figure 19:
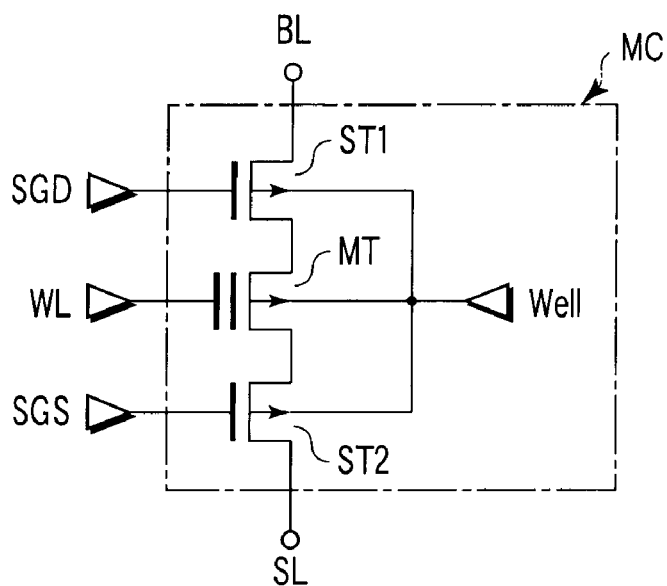
FIG. 19 is an equivalent circuit diagram showing a memory cell in a semiconductor storage device according to the first modification of the first or second embodiment of the present invention.

FIG. 19 is a circuit diagram showing a memory cell MC of a 3Tr-NAND-type flash memory. As shown in FIG. 19, the memory cell MC includes selection transistors ST1 and ST2 and a memory cell transistor MT. The drain of the selection transistor ST1 is connected to a data transfer line BL, and the source thereof is connected to the drain of the memory cell transistor MT. The source of the memory cell transistor MT is connected to the drain of the selection transistor ST2, and the source of the selection transistor ST2 is connected to a source line SL. The gates of the selection transistors ST1 and ST2 are respectively connected to selection gate lines SGD and SGS, and the gate of the memory cell transistor MT is connected to a word line WL. Specifically, this structure corresponds to a modification of the NAND cell 20 where only one memory cell 3 is disposed therein. In the second embodiment described above, the NAND cell 20 shown in FIG. 19 may be replaced with this memory cell MC.

Figure 20:
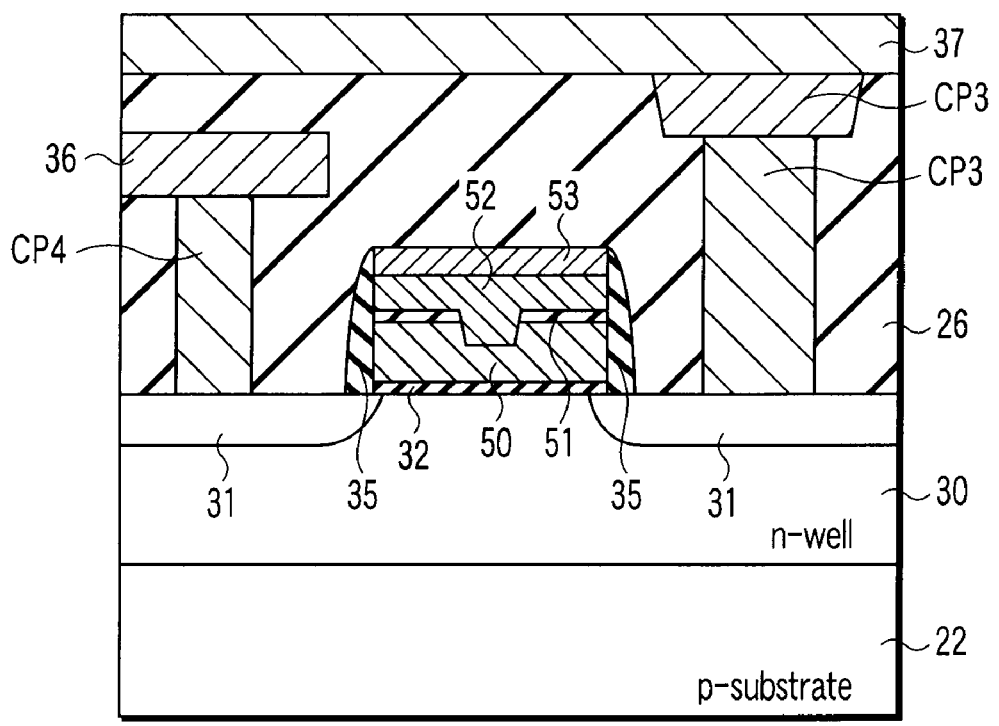
FIG. 20 is an equivalent circuit diagram showing a p-type MISFET in a semiconductor storage device according to the second modification of the first or second embodiment of the present invention.

In the embodiments described above, the gate of the MOS transistor 4 (or 5) explained with reference to FIG. 13 may have a stacked gate structure as in the memory cells. FIG. 20 is a sectional view showing a MOS transistor 4. As shown in FIG. 20, the gate electrode shown in FIG. 13 is replaced with a stacked gate, which includes a poly-crystalline silicon layer 50 formed on a gate insulating film 32, a poly-crystalline silicon layer 52 formed on the poly-crystalline silicon layer 50 with an inter-gate insulating film 51 interposed therebetween, and a silicide layer 53 formed on the poly-crystalline silicon layer 52. The poly-crystalline silicon layers 50 and 52 are electrically connected to each other. According to this arrangement, the gate insulating film 32, poly-crystalline silicon layers 50 and 52, inter-gate insulating film 51, and silicide layer 53 can be respectively formed in the same steps as the gate insulating film 11, poly-crystalline silicon layers 12 and 14, inter-gate insulating film 14, and silicide layer 24 of the NAND-type flash memory.

The embodiments are not limited to the embodiments described above, and it may be modified in various manners in execution phases without departing from the general inventive concept. For example, in the embodiments described above, the NAND-type memory cell is exemplified by a structure that uses a floating gate electrode as a charge storage film. However, the charge storage film may be formed of an insulating film, such as a silicon nitride film, silicon oxynitride film, $Al_2O_3$, $HfAlO_x$, $HfSiO_x$, or a combination thereof. Further, as a method for forming device isolation insulating films and other insulating films, a method for changing silicon into a silicon oxide film or silicon nitride film, or another method, such as a method for implanting, e.g., oxygen ions into deposited silicon or a method for oxidizing deposited silicon, may be used. Further, in the embodiments described above, a p-type Si substrate is used as a semiconductor substrate. However, an n-type Si substrate or SOI substrate may be used, or another single-crystal semiconductor substrate containing silicon, such as SiGe mix crystal or SiGeC mix crystal, may be used. Further, the gate electrode may be made of a silicide or polycide, such as SiGe mix crystal, SiGeC mix crystal, TiSi, NiSi, CoSi, TaSi, WSi, or MoSi, or a metal, such as Ti, Al, Cu, TiN, or W. The gate electrode may be made of poly-crystalline or may have a multi-layered structure of the materials described above. Further, the gate electrode 15 may be made of amorphous Si, amorphous SiGe, or amorphous SiGeC, or may have a multi-layered structure of these materials.

Figure 21:
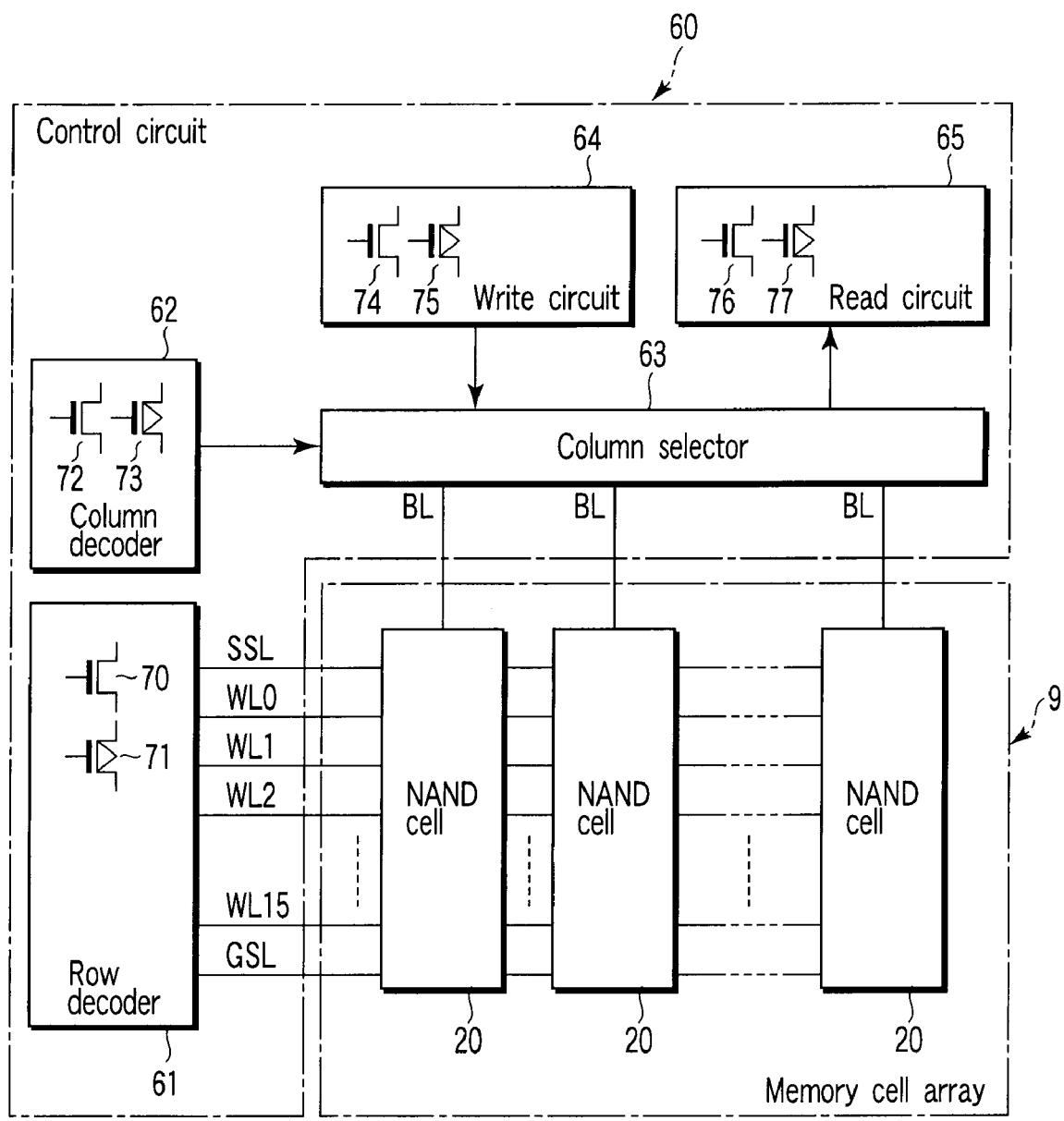
FIG. 21 is a block diagram showing a semiconductor storage device according to the first or second embodiment of the present invention.

The MIS transistors 4 and 5 described in the embodiments may be used as MOS transistors in a control circuit for controlling a writing operation, reading operation, and erasing operation of data relative to memory cells 3. FIG. 21 is a block diagram showing a NAND-type EEPROM in such a case.

As shown in FIG. 21, the NAND-type EEPROM includes a memory cell array 9 explained with reference to the embodiments described above, and a control circuit 60 for controlling a writing operation, reading operation, and erasing operation of data relative to memory cells 3.

The control circuit 60 includes a row decoder 61, a column decoder 62, a column selector 63, a write circuit 64, and a read circuit 65.

The row decoder 61 includes an n-channel MOS transistor 70 and a p-channel MOS transistor 71. The row decoder 61 performs selection of word lines WL0 to WL15 in accordance with row address signals supplied from the outside. In data reading, the row decoder 61 acts to perform the following operation. Specifically, block selection lines SSL and GSL are supplied with a positive voltage, so that selection transistors ST1 and ST2 are turned on. Further, one of the word lines WL0 to WL15 is selected, and the selected word line is supplied with 0V, while the non-selected word lines are supplied with a positive voltage. Consequently, the memory cells 3 connected to the non-selected word lines are turned on. In data writing, the row decoder 61 acts to perform the following operation. Specifically, the block selection line SSL is supplied with a positive voltage, so that the selection transistors ST1 are turned on. At this time, the selection transistors ST2 are turned off. Further, one of the word lines WL0 to WL15 is selected, and the selected word line is supplied with, e.g., 20V. In this state, write data is supplied through bit lines BL into the selected memory cells. Consequently, in each selected memory cell, in which the source and drain have an equal electric potential, electrons are injected into the floating gate by means of FN tunneling, in accordance with write data. In data erasing, the row decoder 61 acts to perform the following operation. Specifically, all the word lines WL0 to WL15 are supplied with 0V, while the p-type well region 10 in which the memory cell array 9 is formed is supplied with, e.g., 20V.

The column decoder 62 includes an n-channel MOS transistor 72 and a p-channel MOS transistor 73. The column decoder 62 performs selection of the bit lines BL in accordance with column address signals supplied from the outside.

The column selector 63 connects the bit lines BL to the write circuit 64 or read circuit 65 in accordance with selecting operations performed by the column decoder 62.

The write circuit 64 includes an n-channel MOS transistor 74 and a p-channel MOS transistor 75. In data writing, the write circuit 64 transfers write data to the bit lines BL. The write data is sent to the selected memory cells through the bit lines BL and the current passages of the selection transistors ST1.

The read circuit 65 includes an n-channel MOS transistor 76 and a p-channel MOS transistor 77. In data reading, the read circuit 65 senses and amplifies data read out to the bit lines BL.

In the arrangement described above, at least one of the p-channel MOS transistors 71, 73, 75, and 77 may be arranged to have the structure of the MIS transistors 3 and 4 explained in the embodiments described above. Specifically, at least one of the p-channel MOS transistors 71, 73, 75, and 77 is arranged such that the current passage thereof is set parallel to the [010]-direction or [100]-direction of a semiconductor wafer 1. Not only the p-channel MOS transistors 71, 73, 75, and 77, the n-channel MOS transistor 70, 72, 74, 76 may be arranged such that the current passage thereof is set parallel to the [010]-direction or [100]-direction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell block including a plurality of n-type first MIS transistors with current passages connected in series,
   each of the first MIS transistors including a source, a drain, and a charge storage layer formed on a (001)-plane of a semiconductor substrate with a gate insulating film interposed therebetween and configured to store data, and
   a direction from the source to the drain in each of the first MIS transistors being set parallel to a [100]-direction or [010]-direction of the semiconductor substrate.

2. The device according to claim 1, wherein, in writing the data at each of the first MIS transistors, the source and the drain thereof are set to have an equal electric potential, while a gate thereof is supplied with a positive voltage, such that electrons are injected through the gate insulating film into the charge storage layer thereof.

3. The device according to claim 1, wherein writing the data at each of the first MIS transistors is performed by FN tunneling.

4. The device according to claim 1, further comprising:
   a selection transistor with a current passage connected in series to one of the current passages of the first MIS transistors; and
   a data transfer line connected to the selection transistor and configured to supply write data to the first MIS transistors through the selection transistor,
   wherein, in writing the data at each of the first MIS transistors, a gate voltage thereof is set to be higher than a gate voltage of the selection transistor.

5. The device according to claim 1, further comprising:
   a p-type second MIS transistor formed on the (001)-plane of the semiconductor substrate,
   wherein a direction from a source to a drain in the second MIS transistor is set parallel to the [100]-direction or [010]-direction of the semiconductor substrate.

6. A semiconductor memory device comprising:
   an n-type first selection transistor formed on a (001)-plane of a semiconductor substrate;
   an n-type second selection transistor formed on the (001)-plane of the semiconductor substrate; and
   a plurality of n-type memory cell transistors with current passages connected in series between a source of the first selection transistor and a drain of the second selection transistor, each of the memory cell transistors including a charge storage layer formed on the (001)-plane of the semiconductor substrate and configured to store data, and each of the current passages of the memory cell transistors being set parallel to a [100]-direction or [010]-direction of the semiconductor substrate.

7. The device according to claim 6, wherein the first selection transistor and the second selection transistor have current passages set parallel to the [100]-direction or [010]-direction of the semiconductor substrate.

8. The device according to claim 6, further comprising:
   a control circuit configured to control at least one of a writing operation, a reading operation, and a erasing operation of data relative to the memory cell transistors,
   wherein the control circuit includes an n-type first MIS transistor and a p-type second MIS transistor formed on the (001)-plane of the semiconductor substrate, and the second MIS transistor has an current passage set parallel to the [100]-direction or [010]-direction of the semiconductor substrate.

9. The device according to claim 6, wherein each of the memory cell transistors includes the charge storage layer formed on the semiconductor substrate with a gate insulating film interposed therebetween, and a control gate formed on the charge storage layer with the inter-gate insulating film interposed therebetween, and wherein, in data writing at each of the memory cell transistors, a source and a drain thereof are set to have an equal electric potential, while the control gate thereof is supplied with a positive voltage, such that electrons are injected through the gate insulating film into the charge storage layer thereof.

10. The device according to claim 6, wherein writing the data at each of the memory cell transistors is performed by FN tunneling.

11. The device according to claim 6, further comprising a bit line connected to a drain of the first selection transistor and configured to supply write data to the memory cell transistors through an current passage of the first selection transistor.

* * * * *